United States Patent
Numata et al.

(10) Patent No.: US 8,058,778 B2
(45) Date of Patent: Nov. 15, 2011

(54) METHOD OF MANUFACTURING PIEZOELECTRIC VIBRATOR, PIEZOELECTRIC VIBRATOR, OSCILLATOR, ELECTRONIC DEVICE, AND RADIO-CLOCK

(75) Inventors: Masashi Numata, Chiba (JP); Kiyoshi Aratake, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/857,273

(22) Filed: Aug. 16, 2010

(65) Prior Publication Data
US 2010/0308695 A1 Dec. 9, 2010

Related U.S. Application Data

(63) Continuation of application No. PCT/JP2008/072889, filed on Dec. 16, 2008.

(30) Foreign Application Priority Data

Feb. 18, 2008 (JP) ................................ 2008-035509

(51) Int. Cl.
*H01L 41/053* (2006.01)
*H01L 41/047* (2006.01)

(52) U.S. Cl. ......... 310/344; 310/348; 310/365; 310/366

(58) Field of Classification Search .................. 310/344, 310/348, 365, 366, 370
See application file for complete search history.

(56) References Cited

U.S. PATENT DOCUMENTS 4,943,955 A * 7/1990 Rabian et al. ................. 368/155
(Continued)

FOREIGN PATENT DOCUMENTS
JP 2002-124845 A 4/2002
(Continued)

OTHER PUBLICATIONS

International Search Report for International Application No. PCT/JP2008/072889, dated Mar. 17, 2009, 2 pages.

*Primary Examiner* — Thomas Dougherty
(74) *Attorney, Agent, or Firm* — Brinks Hofer Gilson & Lione

(57) ABSTRACT

There is provided a piezoelectric vibrator 1 that includes a base substrate 2, a lid substrate 3, a piezoelectric vibrating reed 4, a pair of external electrodes 38 and 39, a pair of through electrodes 32 and 33, and routing electrodes 36 and 37. The lid substrate 3 includes a recess 3a for a cavity and is bonded to the base substrate so that the recess faces the base substrate. The piezoelectric vibrating reed 4 is bonded to the upper surface of the base substrate in a cavity that is formed between both the substrates. The pair of external electrodes 38 and 39 is formed on the lower surface of the base substrate. The pair of through electrodes 32 and 33 is formed so as to pass through the base substrate and is electrically connected to the pair of external electrodes, respectively. The routing electrodes 36 and 37 are formed on the upper surface of the base substrate and electrically connect the pair of through electrodes to the piezoelectric vibrating reed. The through electrodes include electrode films 32a and 33a that are formed on the inner surfaces of the through holes 30 and 31, and glass bodies 32b and 33b that are fixed to the inner surfaces of the through holes with the electrode films interposed therebetween so as to close the through holes.

8 Claims, 17 Drawing Sheets

U.S. PATENT DOCUMENTS

| | | | |
|---|---|---|---|
| 5,406,034 A * | 4/1995 | Frei et al. | 174/266 |
| 5,599,744 A * | 2/1997 | Koh et al. | 438/660 |
| 5,661,267 A * | 8/1997 | Isaak | 174/264 |
| 5,717,247 A * | 2/1998 | Koh et al. | 257/686 |
| 5,832,599 A * | 11/1998 | Isaak | 29/840 |
| 7,973,454 B1 * | 7/2011 | Chen et al. | 310/344 |
| 2009/0117336 A1 | 5/2009 | Usui et al. | |
| 2011/0163637 A1 * | 7/2011 | Hashi | 310/344 |
| 2011/0187472 A1 * | 8/2011 | Fukuda | 331/158 |

FOREIGN PATENT DOCUMENTS

| | | |
|---|---|---|
| JP | 2006-279872 A | 10/2006 |
| JP | 2007-013636 A | 1/2007 |
| JP | 2007-267101 A | 10/2007 |
| JP | 2007-311433 A | 11/2007 |
| WO | WO 2006/129354 A1 | 12/2006 |

\* cited by examiner

METHOD OF MANUFACTURING PIEZOELECTRIC VIBRATOR, PIEZOELECTRIC VIBRATOR, OSCILLATOR, ELECTRONIC DEVICE, AND RADIO-CLOCK

RELATED APPLICATIONS

This application is a continuation of PCT/JP2008/072889 filed on Dec. 16, 2008, which claims priority to Japanese Application No. 2008-035509 filed on Feb. 18, 2008. The entire contents of these applications are incorporated herein by reference.

TECHNICAL FIELD

The present invention relates to a surface mounted (SMD) piezoelectric vibrator where a piezoelectric vibrating reed is sealed in a cavity formed between two bonded substrates, a method of manufacturing the piezoelectric vibrator, and an oscillator, an electronic device, and a radio clock that each include the piezoelectric vibrator.

BACKGROUND ART

In recent years, a piezoelectric vibrator, which employs crystal or the like as a time source, a timing source of a control signal or the like, a reference signal source or the like, has been used in a cell phone or a portable information terminal device. Various piezoelectric vibrators have been known as this kind of piezoelectric vibrator, but a surface mounted piezoelectric vibrator has been known as one of the piezoelectric vibrators. As this kind of piezoelectric vibrator, there is generally known a piezoelectric vibrator having a three-layer structure where a piezoelectric substrate including a piezoelectric vibrating reed is bonded to a base substrate and a lid substrate so as to be interposed between the base substrate and the lid substrate in a vertical direction. In this case, the piezoelectric vibrator is received in a cavity (closed chamber) that is formed between the base substrate and the lid substrate. Further, in recent years, there has been developed a piezoelectric vibrator having not a three-layer structure but a two-layer structure.

This type of piezoelectric vibrator has a two-layer structure where a base substrate and a lid substrate are directly bonded to each other and a piezoelectric vibrating reed is received in a cavity formed between both the substrates. The two-layer structure type piezoelectric vibrators are superior to three-layer structure type piezoelectric vibrators in terms of the reduction in thickness. Accordingly, the two-layer structure type piezoelectric vibrators are preferably used. As one of the two-layer structure type piezoelectric vibrators, there is known a piezoelectric vibrator where a piezoelectric vibrating reed and external electrodes formed on a base substrate are electrically connected to each other by using conductive members that are formed to pass through the base substrate (see Patent Citations 1 and 2).

As shown in FIGS. 21 and 22, a piezoelectric vibrator 200 includes a base substrate 201 and a lid substrate 202 that are anodically bonded to each other with a bonding film 207 interposed therebetween, and a piezoelectric vibrating reed 203 that is sealed in a cavity C formed between both the substrates 201 and 202. The piezoelectric vibrating reed 203 is, for example, a tuning-fork type vibrating reed, and is mounted on the upper surface of the base substrate 201 in the cavity C by a conductive adhesive E.

Each of the base substrate 201 and the lid substrate 202 is an insulating substrate that is made of, for example, ceramic or glass. Through holes 204, which pass through the substrate 201, are formed at the base substrate 201 of both the substrates 201 and 202. Further, a conductive member 205 is fitted to the through hole 204 so as to close the through hole 204. The conductive member 205 is electrically connected to an external electrode 206 formed on the lower surface of the base substrate 201, and is electrically connected to a piezoelectric vibrating reed 203 mounted in the cavity C.

Patent Citation 1: JP-A-2002-124845
Patent Citation 2: JP-A-2006-279872

Meanwhile, in the above-mentioned two-layer structure type piezoelectric vibrator, the conductive member 205 has two functions, that is, a function to close the through hole 204 so as to maintain airtightness in the cavity C and a function to electrically connect the piezoelectric vibrating reed 203 to the external electrode 206. In particular, if the conductive member insufficiently comes into close contact with the through hole 204, there is a concern that the airtightness in the cavity C is impaired. Further, if the conductive member insufficiently comes into close contact with the conductive adhesive E or the external electrode 206, the malfunction of the piezoelectric vibrating reed 203 is caused. Accordingly, even to eliminate these troubles in the related art, it is necessary to form the conductive member 205 so that the conductive member completely closes the through hole 204 while being solidly fixed to the inner surface of the through hole 204 and recesses are not formed on the surfaces of the conductive member.

However, Patent Citations 1 and 2 disclose that the conductive member 205 is formed by conductive paste (Ag paste, Au-Sn paste, or the like), but do not disclose a specific method of manufacturing the conductive member, that is, how to actually form the conductive member.

When conductive paste is used, it is generally necessary to harden the conductive paste by firing the conductive paste. That is, it is necessary to harden the conductive paste by performing firing after the through hole 204 is filled with the conductive paste. Meanwhile, if firing is performed, organic materials contained in the conductive paste are evaporated and disappear. For this reason, the volume of the fired conductive paste is generally decreased in comparison with the volume of the unfired conductive paste (for example, when Ag paste is used as the conductive paste, the volume of the conductive paste is decreased by about 20%). For this reason, even though the conductive member 205 is formed using the conductive paste, there is a concern that recesses are formed on the surfaces of the conductive paste or a through hole is formed at the center of the conductive paste in an extreme case.

As a result, there has been a possibility that the airtightness in the cavity C is impaired or electric conductivity between the piezoelectric vibrating reed 203 and the external electrode 206 is impaired.

SUMMARY OF THE INVENTION

The invention has been made in consideration of the above-mentioned circumstances, and an object of the invention is to provide a high-quality two-layer structure type surface mounted piezoelectric vibrator that reliably maintains airtightness in a cavity and secures stable electric conductivity between a piezoelectric vibrating reed and external electrodes. Further, there are provided a method of efficiently manufacturing the piezoelectric vibrators at a time, and an oscillator, an electronic device, and a radio clock that each include the piezoelectric vibrator.

The invention provides the following means in order to solve the above-mentioned problems.

According to the invention, there is provided a piezoelectric vibrator that includes a base substrate, a lid substrate, a piezoelectric vibrating reed, a pair of external electrodes, a pair of through electrodes, and routing electrodes. The lid substrate includes a recess for a cavity and is bonded to the base substrate so that the recess faces the base substrate. The piezoelectric vibrating reed is bonded to the upper surface of the base substrate so as to be received in a cavity that is formed between the base substrate and the lid substrate by the recess. The pair of external electrodes is formed on the lower surface of the base substrate. The pair of through electrodes is formed so as to pass through the base substrate, maintains airtightness in the cavity, and is electrically connected to the pair of external electrodes, respectively. The routing electrodes are formed on the upper surface of the base substrate and electrically connect the pair of through electrodes to the bonded piezoelectric vibrating reed. The through electrodes include electrode films that are formed on the inner surfaces of through holes passing though the base substrate and glass bodies that are fixed to the inner surfaces of the through holes with the electrode films interposed therebetween so as to close the through holes.

According to the invention, there is provided a method of manufacturing a plurality of piezoelectric vibrators at a time by using a base substrate wafer and a lid substrate wafer. A piezoelectric vibrating reed of the piezoelectric vibrator is sealed in a cavity formed between a base substrate and a lid substrate that are bonded to each other. The method includes a recess forming process for forming a plurality of recesses for cavities, which form the cavities when both the wafers are superimposed, on the lid substrate wafer; a through electrode forming process for forming a plurality of pairs of through electrodes, which passes through the base substrate wafer, at the base substrate wafer; a routing electrode forming process for forming a plurality of routing electrodes, which is electrically connected to the pairs of through electrodes, respectively, on the upper surface of the base substrate wafer; a mounting process for bonding the plurality of piezoelectric vibrating reeds to the upper surface of the base substrate wafer through the routing electrodes; a superimposing process for superimposing the lid substrate wafer on the base substrate wafer so that the piezoelectric vibrating reeds are received in the cavities surrounded by the recesses and both the wafers; a bonding process for bonding the lid substrate wafer to the base substrate wafer and sealing the piezoelectric vibrating reeds in the cavities; an external electrode forming process for forming a plurality of pairs of external electrodes, which is electrically connected to the pairs of through electrodes, respectively, on the lower surface of the base substrate wafer; and a cutting process for cutting both the wafers, which are bonded to each other, into the plurality of piezoelectric vibrators. The through electrode forming process includes a through hole forming process for forming a plurality of pairs of through holes, which passes through the base substrate wafer, at the base substrate wafer; an electrode film forming process for forming electrode films on the inner surfaces of the plurality of through holes; a glass body setting process for fitting lumps of a glass body, of which the volume is substantially equal to the volume of the through holes, into the through holes on which the electrode films have been formed; and a heating process for heating the fitted lumps of the glass body at a predetermined temperature and melting the fitted lumps of the glass body, and fixing the lumps of the glass body to the inner surfaces of the through holes with the electrode films interposed therebetween so as to close the through holes on which the electrode films have been formed.

In the piezoelectric vibrator and the method of manufacturing the piezoelectric vibrators according to the invention, first, there is performed a recess forming process for forming a plurality of recesses for cavities on the lid substrate wafer. These recesses are recesses that form the cavities when both the wafers are superimposed later.

Further, simultaneously with the recess forming process or before and after the recess forming process, there is performed a through electrode forming process for forming a plurality of pairs of through electrodes at the base substrate wafer. In this case, when both the wafers are superimposed later, the plurality of pairs of through electrodes is formed so as to be in the recesses formed on the lid substrate wafer.

The through electrode forming process will be described in detail. First, there is performed a through hole forming process for forming a plurality of pairs of through holes, which passes through the base substrate wafer, at the base substrate wafer. Subsequently, there is performed an electrode film forming process for forming electrode films on the inner surfaces of the plurality of through holes. Then, there is performed a glass body setting process for fitting lumps of a glass body into the through holes on which the electrode films have been formed. In this case, the lump of a glass body of which the volume is substantially equal to the volume of the through hole is used as the lump of the glass body.

Subsequently, there is performed a heating process for heating the fitted lumps of the glass body at a predetermined temperature. First, the lumps of the glass body, which are fitted into the through holes, are melted by the heating process. In this case, since the volume of the fitted lumps of the glass body is substantially equal to the volume of the through holes, the through holes are filled with the melted glass bodies without spaces, so that the through holes are closed. Accordingly, the glass bodies are solidly fixed to the inner surfaces of the through holes with the electrode films interposed therebetween so as to close the through holes. As a result, the through electrodes are formed of the electrode films and the glass bodies.

In particular, when the through electrodes are formed, the through electrodes are formed using the electrode films and the glass bodies without using paste, unlike the related art. If paste is used, the paste needs to be fired. In general, since organic materials contained in the paste are evaporated during the firing, the volume of fired paste is significantly decreased in comparison with the volume of unfired paste. For this reason, if paste is fired after being filled in the through holes alone, large recesses are formed on the surfaces of the fired paste.

However, since paste is not used and the electrode films and the glass bodies are used as described above, there is no concern that large recesses are formed on the surfaces of the glass bodies and electrode films. Meanwhile, the volume of each of the glass bodies is slightly decreased in the heating process. However, unlike the case of the firing of paste, the decrease of the volume of the glass bodies is not significant enough to form a visible recess and is in a negligible range.

Accordingly, the surfaces of the base substrate wafer are substantially flush with the surfaces of the glass bodies. That is, it may be possible to make the surfaces of the base substrate wafer be substantially flush with the surfaces of the through electrodes.

Then, there is performed a routing electrode forming process for forming a plurality of routing electrodes, which is electrically connected to the pairs of through electrodes, respectively, on the upper surface of the base substrate wafer by performing patterning on the upper surface of the base substrate wafer with a conductive material. In this case, when both the wafers are superimposed later, the routing electrodes are formed so as to be in the recesses formed on the lid substrate wafer.

In particular, the through electrodes, which are formed of the electrode films and the glass bodies, are substantially flush with the upper surface of the base substrate wafer as described above. For this reason, the routing electrodes, which are patterned on the upper surface of the base substrate wafer, come into close contact with the through electrodes without spaces therebetween. Accordingly, it may be possible to reliably secure the electric conductivity between the routing electrodes and the through electrodes.

After that, there is performed a mounting process for bonding the plurality of piezoelectric vibrating reeds to the upper surface of the base substrate wafer through the routing electrodes. Accordingly, the respective bonded piezoelectric vibrating reeds are electrically connected to the pairs of through electrodes through the routing electrodes. After the mounting is terminated, there is performed a superimposing process for superimposing the lid substrate wafer on the base substrate wafer. Accordingly, the plurality of bonded piezoelectric vibrating reeds is received in the cavities that are surrounded by the recess and both the wafers.

Then, there is performed a bonding process for bonding the lid substrate wafer and the base substrate wafer that are superimposed. Accordingly, since both the wafers solidly come into close contact with each other, it may be possible to seal the piezoelectric vibrating reeds in the cavities. In this case, since the through holes formed at the base substrate wafer are closed by the through electrodes, the airtightness in the cavities is not impaired by the through holes. In particular, since the glass bodies of the through electrodes solidly come into close contact with the inner surfaces of the through holes with the electrode films interposed therebetween so as to close the through holes, it may be possible to reliably maintain airtightness in the cavity.

After that, there is performed an external electrode forming process for forming a plurality of pairs of external electrodes, which is electrically connected to the pairs of through electrodes, respectively, on the lower surface of the base substrate wafer by performing patterning on the lower surface of the base substrate wafer with a conductive material. Even in this case, the through electrodes are substantially flush with the lower surface of the base substrate wafer like when the routing electrodes are formed. For this reason, the patterned external electrodes come into close contact with the through electrodes without spaces therebetween. Accordingly, it may be possible to reliably secure the electric conductivity between the external electrodes and the through electrodes. Due to this process, it may be possible to actuate the piezoelectric vibrating reed, which is sealed in the cavity, by using the external electrodes.

Finally, there is performed a cutting process for cutting the base substrate wafer and the lid substrate wafer, which are bonded to each other, into the plurality of piezoelectric vibrators.

As a result, it may be possible to manufacture a plurality of two-layer structure type surface mounted piezoelectric vibrators, of which the piezoelectric vibrating reed is sealed in a cavity formed between a base substrate and a lid substrate bonded to each other, at a time.

In particular, since the through electrodes are formed to be substantially flush with the base substrate, it may be possible to make the through electrodes reliably come into close contact with the routing electrodes and the external electrodes. As a result, stable electric conductivity between the piezoelectric vibrating reed and the external electrodes may be secured, so that it may be possible to improve the reliability of operating performance. Therefore, it may be possible to improve the performance of the piezoelectric vibrator. Moreover, since the through electrodes are formed using the electrode films that are formed on the inner surfaces of the through holes, it may be possible to obtain very stable electric conductivity.

Furthermore, since it may be possible to reliably maintain airtightness in the cavity, it may be possible to improve the quality of the piezoelectric vibrator even in this regard.

In addition, since it may be possible to form the through electrodes by a simple method using the electrode films and the glass bodies, it may be possible to simplify processes.

Further, in the piezoelectric vibrator according to the invention, the through holes may be formed so that an opening of the through hole opened to the lower surface of the base substrate is smaller than the opening of the through hole opened to the upper surface of the base substrate.

Furthermore, in the method of manufacturing the piezoelectric vibrator according to the invention, the through holes may be formed in the through hole forming process so that an opening of the through hole opened to the lower surface of the base substrate wafer is smaller than the opening of the through hole opened to the upper surface of the base substrate wafer.

In the piezoelectric vibrator and the method of manufacturing the piezoelectric vibrators according to the invention, the through holes are formed in the through hole forming process so that an opening of the through hole opened to the lower surface of the base substrate wafer is smaller than the opening of the through hole opened to the upper surface of the base substrate wafer. Accordingly, the lumps of the glass body, which are fitted from the upper surface of the base substrate wafer, do not fall out from the lower surface of the base substrate wafer. Therefore, the lumps of the glass body do not fall out and are not lost between the glass body setting process and the heating process. As a result, it may be possible to further simplify processes without requiring extra working hours. In addition, the lumps of the glass body do not fall out from the lower surface of the base substrate wafer, and are held in the through holes. That is, if the lumps of the glass body are merely fitted into the through holes from the upper surface of the base substrate wafer, the lumps of the glass body may be held in the through holes. Accordingly, it may be possible to further simplify processes even in this regard.

Further, in the piezoelectric vibrator according to the invention, the coefficient of thermal expansion of the glass body may be substantially equal to the coefficient of thermal expansion of the base substrate.

Furthermore, in the method of manufacturing the piezoelectric vibrator according to the invention, a glass body of which the coefficient of thermal expansion is substantially equal to the coefficient of thermal expansion of the base substrate wafer may be used as the glass body.

In the piezoelectric vibrator and the method of manufacturing the piezoelectric vibrators according to the invention, the coefficient of thermal expansion of the glass body is substantially equal to the coefficient of thermal expansion of the base substrate wafer. That is, the expansion amount of the glass body is substantially equal to that of the base substrate wafer in the heating process. For this reason, it may be possible to prevent cracks or the like from being generated at the base substrate wafer, so that it may be possible to further improve the quality of the piezoelectric vibrator.

Furthermore, in the piezoelectric vibrator according to the invention, the base substrate and the lid substrate may be anodically bonded to each other with a bonding film, which is formed between both the substrates so as to surround the recess, interposed therebetween.

Moreover, the method of manufacturing the piezoelectric vibrators according to the invention may further include a bonding film forming process for forming a bonding film that surrounds the recesses on the upper surface of the base substrate wafer when the lid substrate wafer is superimposed on the base substrate wafer, before the mounting process. In the bonding process, both the wafers may be anodically bonded to each other with the bonding film interposed therebetween.

In the piezoelectric vibrator and the method of manufacturing the piezoelectric vibrators according to the invention, since the base substrate wafer and the lid substrate wafer are anodically bonded to each other with the bonding film interposed therebetween, both the wafers are more solidly bonded to each other. Accordingly, it may be possible to improve airtightness in the cavity. Therefore, it may be possible to accurately vibrate the piezoelectric vibrating reed, thereby further improving the quality of the piezoelectric vibrator.

Further, in the piezoelectric vibrator according to the invention, the piezoelectric vibrating reed may be bonded by conductive bumps.

Furthermore, in the method of manufacturing the piezoelectric vibrators according to the invention, the piezoelectric vibrating reed may be bonded by conductive bumps in the mounting process.

In the piezoelectric vibrator and the method of manufacturing the piezoelectric vibrators according to the invention, since the piezoelectric vibrating reed is bonded by bumps, it may be possible to float the piezoelectric vibrating reed from the upper surface of the base substrate by the thickness of the bump. Accordingly, it may be possible to naturally secure a minimum vibration gap that is required for the vibration of the piezoelectric vibrating reed. Therefore, it may be possible to further improve the reliability of the operating performance of the piezoelectric vibrator.

Further, in the method of manufacturing the piezoelectric vibrators according to the invention, a lump of a glass body, which has been temporarily fired in advance, may be used in the glass body setting process.

Since the glass body is temporarily fired in advance in the method of manufacturing the piezoelectric vibrators according to the invention, the volume of the glass body is hardly decreased when the glass body is heated later. For this reason, higher-quality through electrodes may be formed, so that it may be possible to more reliably maintain airtightness in the cavity. As a result, it may be possible to further improve the quality of the piezoelectric vibrator.

Further, according to the invention, there is provided an oscillator where the piezoelectric vibrator according to the invention is electrically connected to an integrated circuit as an oscillating component.

Furthermore, according to the invention, there is provided an electronic device where the piezoelectric vibrator according to invention is electrically connected to a clock unit.

In addition, according to the invention, there is provided a radio clock where the piezoelectric vibrator according to the invention is electrically connected to a filter unit.

The oscillator, the electronic device, and the radio clock according to the invention each include the high-quality piezoelectric vibrator that has reliable airtightness in the cavity and improved reliability of operation. Accordingly, likewise, it may also be possible to improve the quality of the oscillator, the electronic device, and the radio clock by improving the reliability of operation.

The piezoelectric vibrator according to the invention may be a high-quality two-layer structure type surface mounted piezoelectric vibrator that reliably maintains airtightness in a cavity and secures stable electric conductivity between a piezoelectric vibrating reed and external electrodes.

Further, according to the method of manufacturing piezoelectric vibrators of the invention, it may be possible to efficiently manufacture the above-mentioned piezoelectric vibrators at a time. Accordingly, it may be possible to reduce the manufacturing cost of the piezoelectric vibrator.

Furthermore, since the oscillator, the electronic device, and the radio clock each include the above-mentioned piezoelectric vibrator, likewise, it may also be possible to improve the quality of the oscillator, the electronic device, and the radio clock by improving the reliability of operation.

DETAILED DESCRIPTION OF THE PREFERRED EMBODIMENTS

Figure 1:
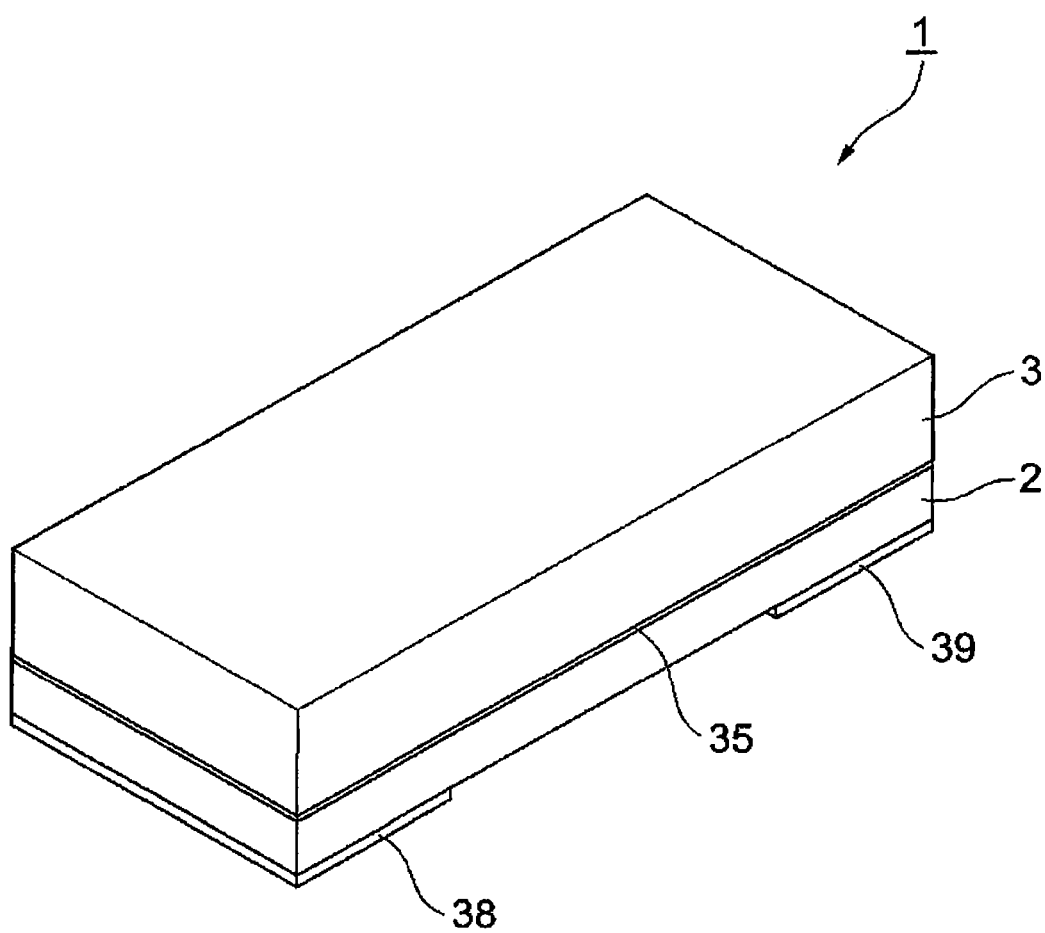
FIG. 1 is a perspective view showing the appearance of an embodiment of a piezoelectric vibrator according to the invention.
Figure 2:
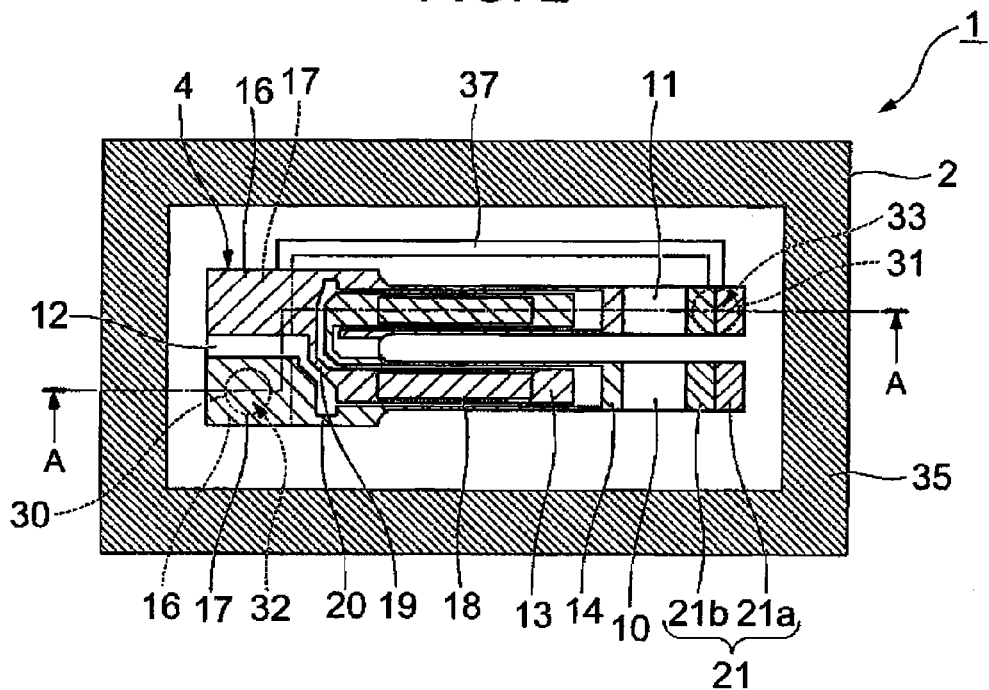
FIG. 2 is a view showing the internal structure of the piezoelectric vibrator shown in FIG. 1, and is a view showing a piezoelectric vibrating reed from the upper side when a lid substrate is removed.

An embodiment of the invention will be described below with reference to FIGS. 1 to 17.

As shown in FIGS. 1 to 4, a piezoelectric vibrator 1 according to this embodiment is formed in a box shape where two layers (a base substrate 2 and a lid substrate 3) are laminated, and is a surface mounted piezoelectric vibrator 1 where a piezoelectric vibrating reed 4 is received in an inner cavity C.

Meanwhile, for the easy understanding of drawings, an excitation electrode 15, extraction electrodes 19 and 20, mount electrodes 16 and 17, and a weight metal film 21, which are to be described below, are not shown in FIG. 4.

Figure 5:
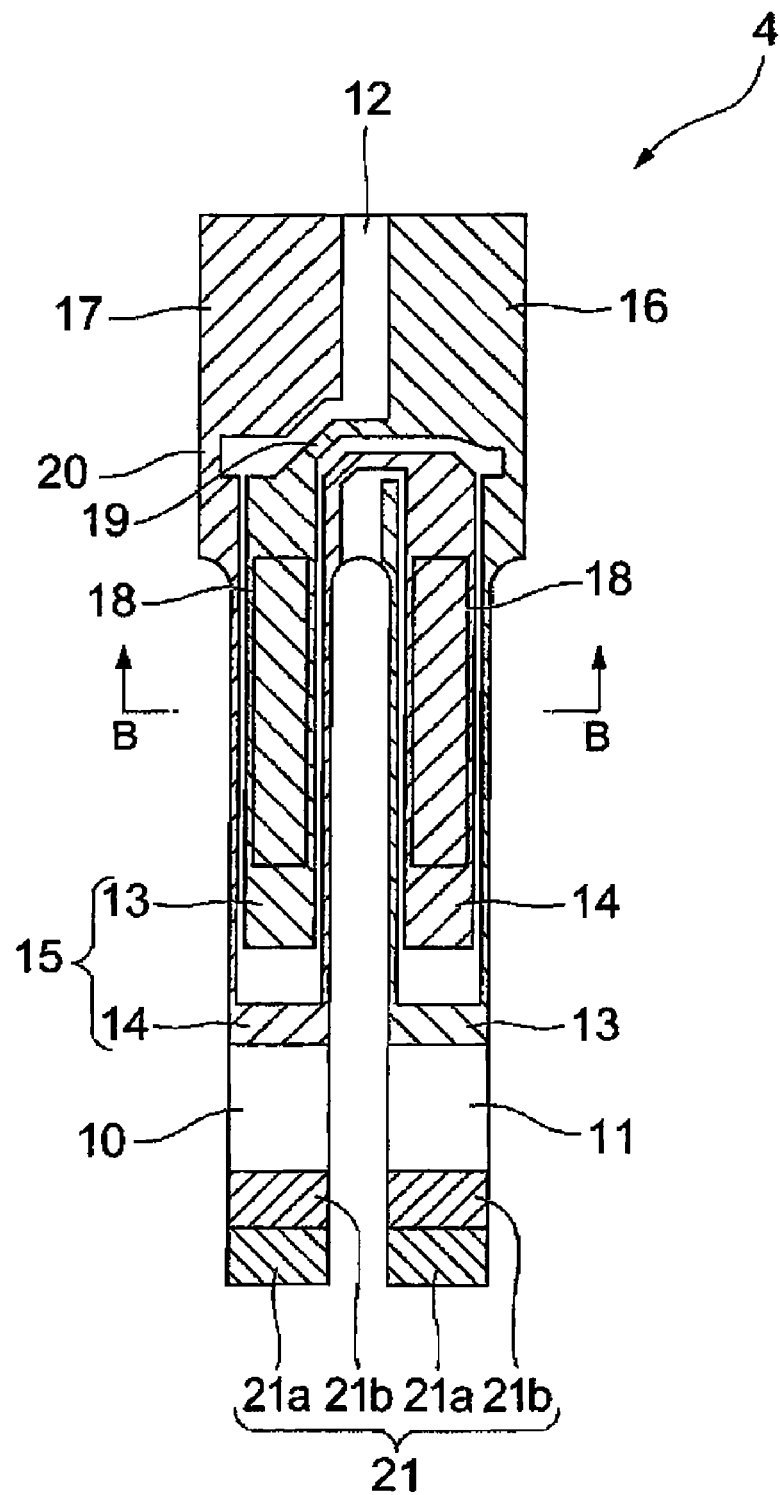
FIG. 5 is a top view of a piezoelectric vibrating reed of the piezoelectric vibrator shown in FIG. 1.
Figure 6:
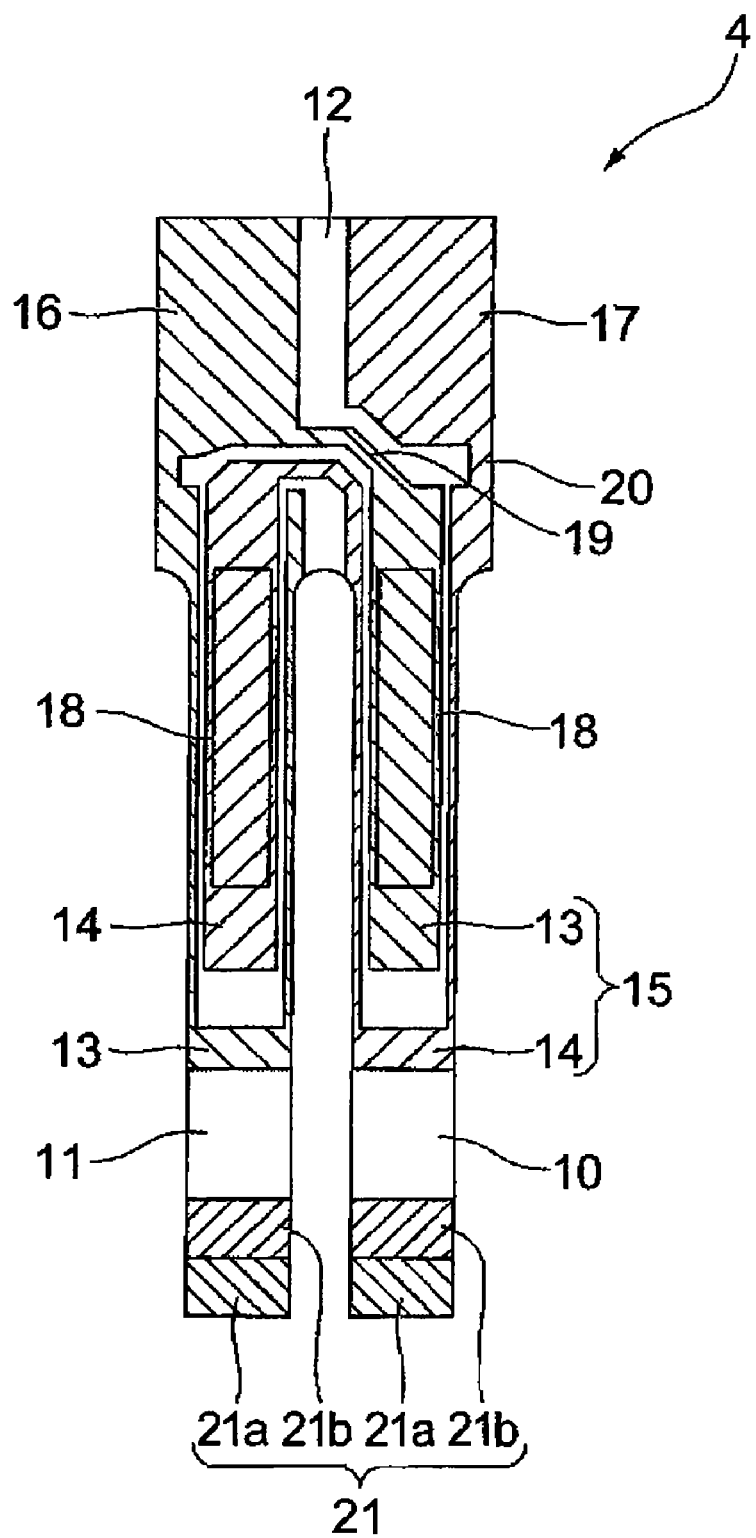
FIG. 6 is a bottom view of the piezoelectric vibrating reed shown in FIG. 5.
Figure 7:
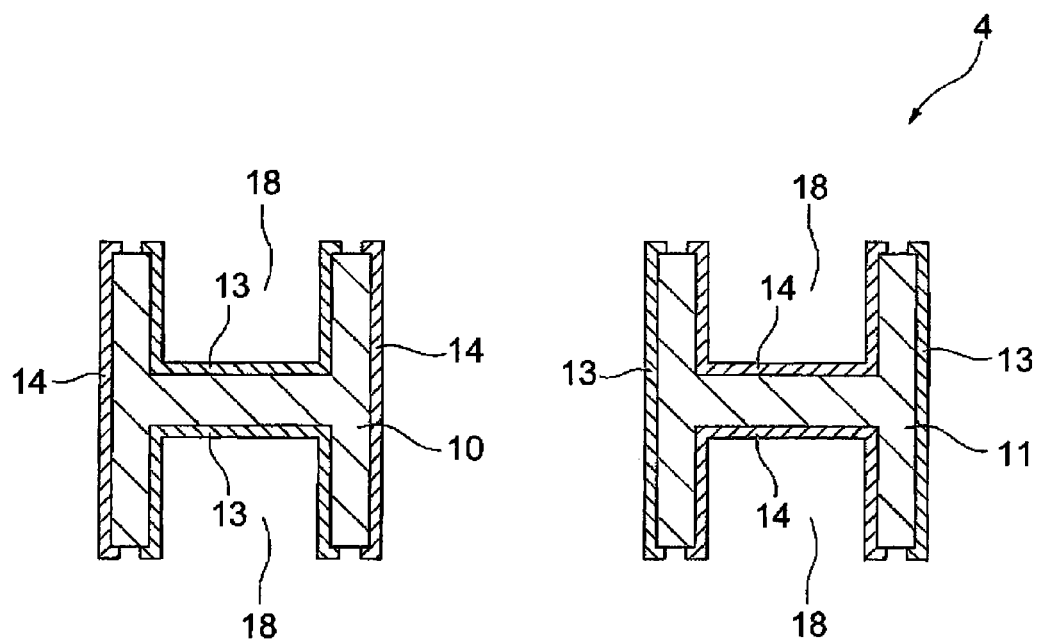
FIG. 7 is a cross-sectional view taken along a line B-B shown in FIG. 5.

As shown in FIGS. 5 to 7, the piezoelectric vibrating reed 4 is a tuning-fork type vibrating reed that is made of a piezoelectric material, such as crystal, lithium tantalite, or lithium niobate. When a predetermined voltage is applied to the piezoelectric vibrating reed, the piezoelectric vibrating reed vibrates.

The piezoelectric vibrating reed 4 includes a pair of vibration arm portions 10 and 11 that is disposed parallel to each other, a base portion 12 that integrally fixes the base ends of the pair of vibration arm portions 10 and 11, excitation electrodes 15 that each include first and second excitation electrodes 13 and 14, and mount electrodes 16 and 17 that are electrically connected to the first and second excitation electrodes 13 and 14. The first and second excitation electrodes are formed on the outer surfaces of the pair of vibration arm portions 10 and 11, and vibrate the pair of vibration arm portions 10 and 11.

Further, the piezoelectric vibrating reed 4 of this embodiment includes groove portions 18 that are formed on the main surfaces of the pair of vibration arm portions 10 and 11 in the longitudinal directions of the vibration arm portions 10 and 11, respectively. The groove portions 18 are formed from the base ends of the vibration arm portions 10 and 11 to the substantially middle portions thereof.

The excitation electrode 15 including the first and second excitation electrodes 13 and 14 is an electrode for vibrating the pair of vibration arm portions 10 and 11 at a predetermined resonant frequency in a direction where the vibration arm portions approach each other or are separated from each other. The first and second excitation electrodes are patterned on the outer surfaces of the pair of vibration arm portions 10 and 11 so as to be electrically isolated, respectively. Specifically, as shown in FIG. 7, the first excitation electrode 13 is mainly formed on the groove portions 18 of one vibration arm portion 10 and both side surfaces of the other vibration arm portion 11, and the second excitation electrode 14 is mainly formed on both side surfaces of one vibration arm portion 10 and the groove portions 18 of the other vibration arm portion 11.

Further, as shown in FIGS. 5 and 6, the first and second excitation electrodes 13 and 14 are electrically connected to the mount electrodes 16 and 17 through the extraction electrodes 19 and 20 on both the main surfaces of the base portion 12, respectively. Further, a voltage is applied to the piezoelectric vibrating reed 4 through the mount electrodes 16 and 17.

Meanwhile, the excitation electrodes 15, the mount electrodes 16 and 17, and the extraction electrodes 19 and 20, which have been described above, are formed by forming conductive films made of, for example, chrome (Cr), nickel (Ni), aluminum (Al), or titanium (Ti).

Furthermore, a weight metal film 21, which performs adjustment (frequency adjustment) so as to make the vibrational states of the vibration arm portions be in a predetermined frequency range, is formed at the ends of the pair of vibration arm portions 10 and 11. Meanwhile, the weight metal film 21 is divided into a rough adjustment film 21a that is used to roughly adjust frequency and a fine adjustment film 21b that is used to finely adjust frequency. It may be possible to make the frequency of the pair of vibration arm portions 10 and 11 be in the nominal frequency range of a device by performing frequency adjustment with the rough and fine adjustment films 21a and 21b.

Figure 3:
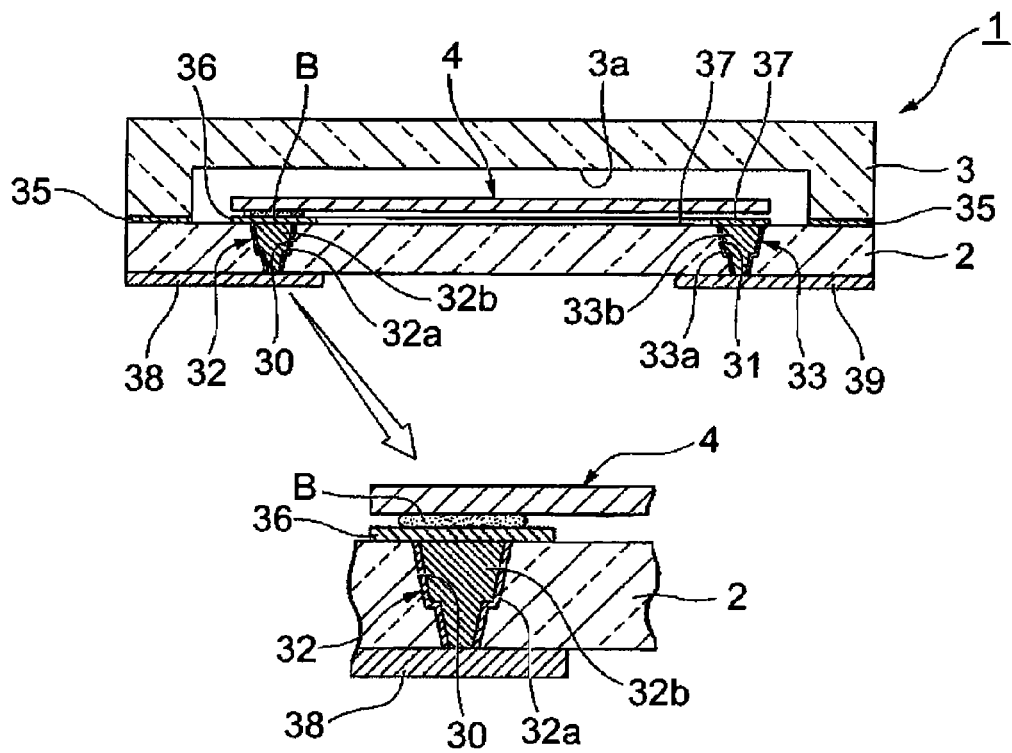
FIG. 3 is a cross-sectional view of the piezoelectric vibrator taken along a line A-A shown in FIG. 2.
Figure 4:
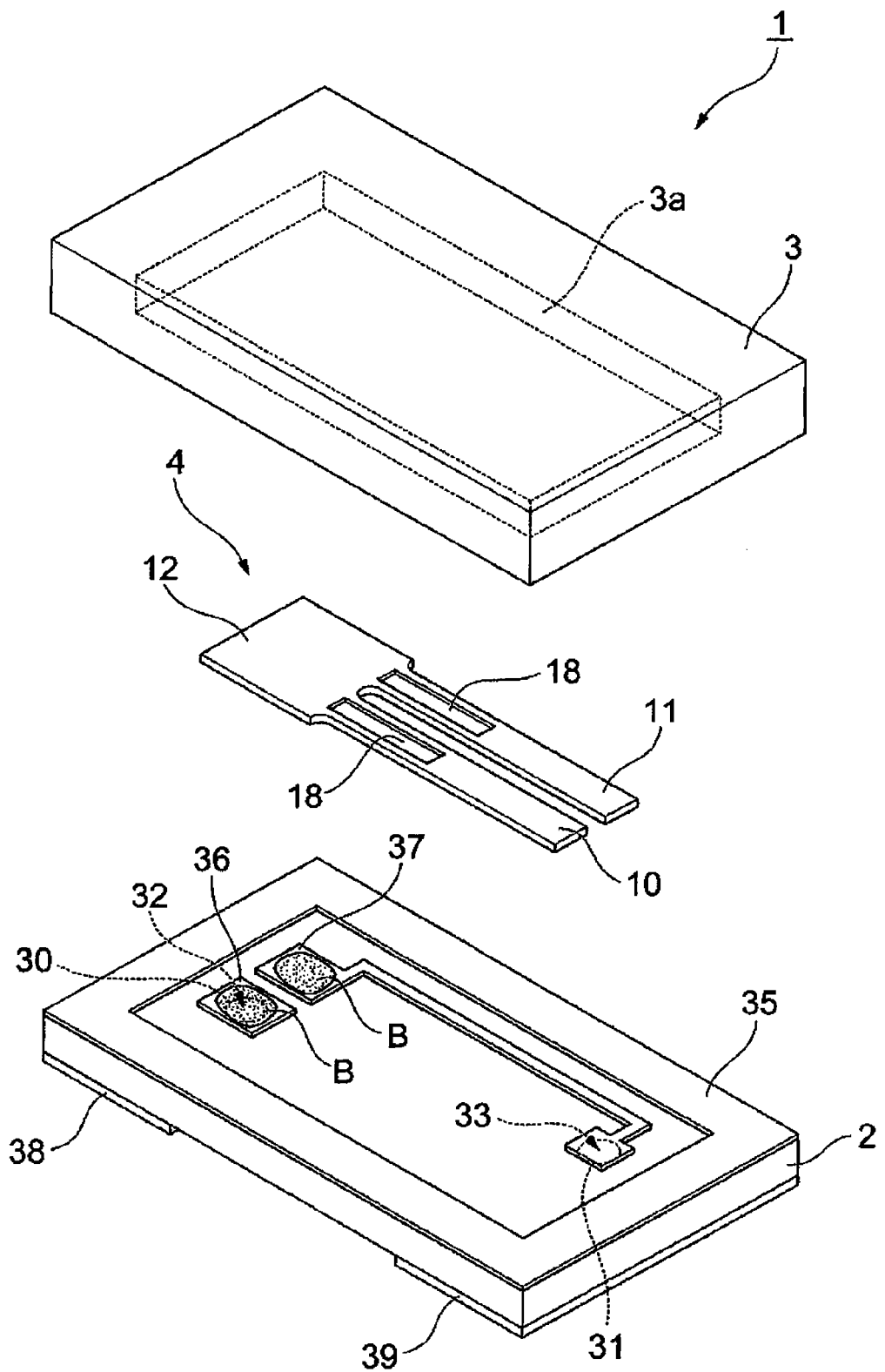
FIG. 4 is an exploded perspective view of the piezoelectric vibrator shown in FIG. 1.

As shown in FIGS. 3 and 4, the piezoelectric vibrating reed 4 having the above-mentioned structure is bonded by bumps B, which are made of gold or the like, on the upper surface of the base substrate 2. More specifically, the pair of mount electrodes 16 and 17 are bonded to two bumps B, which are formed on routing electrodes 36 and 37 (to be described below) patterned on the upper surface of the base substrate 2, so as to come into contact with the bumps, respectively. Accordingly, the piezoelectric vibrating reed 4 is supported so as to be floated from the upper surface of the base substrate 2, and the mount electrodes 16 and 17 are electrically connected to the routing electrodes 36 and 37.

The lid substrate 3 is a transparent insulating substrate that is made of a glass material, for example, soda-lime glass. The lid substrate is formed in the shape of a plate as shown in FIGS. 1, 3, and 4. Further, a rectangular recess 3a in which the piezoelectric vibrating reed 4 is received is formed on a bonding surface of the lid substrate to which the base substrate 2 is bonded. The recess 3a is a recess 3a that forms a cavity C receiving the piezoelectric vibrating reed 4 when both the substrates 2 and 3 are superimposed. Further, the lid substrate 3 is anodically bonded to the base substrate 2 so that the recess 3a faces the base substrate 2.

Like the lid substrate 3, the base substrate 2 is a transparent insulating substrate that is made of a glass material, for example, soda-lime glass. As shown in FIGS. 1 to 4, the base substrate is formed in the shape of a plate so as to have a size capable of being superimposed on the lid substrate 3.

A pair of through holes 30 and 31 passing through the base substrate 2 is formed at the base substrate 2. In this case, the pair of through holes 30 and 31 is formed so as to be in the cavity C. In more detail, one through hole 30 of the through holes 30 and 31 of this embodiment is positioned so as to correspond to the base portion 12 of the mounted piezoelectric vibrating reed 4, and the other through hole 31 thereof is positioned so as to correspond to the ends of the vibration arm portions 10 and 11.

Further, the pair of through holes 30 and 31 is formed so that the opening of the through hole opened to the lower surface of the base substrate 2 is smaller than the opening of the through hole opened to the upper surface of the base substrate as shown in FIG. 3. In more detail, the through holes are formed so that the diameter of the through hole is gradually reduced in two steps toward the lower surface of the base substrate 2 and the through hole has a stepwise tapered shape in cross-sectional view.

Further, a pair of through electrodes 32 and 33, which is formed so as to fill the through holes 30 and 31, is formed at the pair of through holes 30 and 31. The through electrodes 32 and 33 are formed of electrode films 32a and 33a that are formed on the inner surfaces of the through holes 30 and 31, and glass bodies 32b and 33b that are fixed to the inner surfaces of the through holes 30 and 31 with the electrode films 32a and 33a interposed therebetween so as to close the through holes 30 and 31. Further, the through electrodes 32 and 33 function to completely close the through holes 30 and 31 so as to maintain the airtightness in the cavity C, and to electrically connect the routing electrodes 36 and 37 to external electrodes 38 and 39 to be described below.

Meanwhile, the electric conductivity of the through electrodes 32 and 33 is secured by the electrode films 32a and 33a.

As shown in FIGS. 1 to 4, a bonding film 35 for anodic bonding and the pair of routing electrodes 36 and 37 are patterned on the upper surface of the base substrate 2 (the bonding surface to which the lid substrate 3 is bonded) with a conductive material (for example, aluminum). Among the bonding film and the routing electrodes, the bonding film 35 is formed along the periphery of the base substrate 2 so as to surround the recess 3a that is formed on the lid substrate 3.

Further, the pair of routing electrodes 36 and 37 is patterned so as to electrically connect one through electrode 32 of the pair of through electrodes 32 and 33 to one mount electrode 16 of the piezoelectric vibrating reed 4 and electrically connect the other through electrode 33 of the pair of through electrodes to the other mount electrode 17 of the piezoelectric vibrating reed 4. In more detail, one routing electrode 36 is formed immediately above the through electrode 32 so as to be positioned immediately below the base portion 12 of the piezoelectric vibrating reed 4. Further, the other routing electrode 37 is formed so as to be routed from a position adjacent to one routing electrode 36 to the ends of the vibration arm portions 10 and 11 along the vibration arm portions 10 and 11 and be then positioned immediately above the other through electrode 33.

Moreover, the bumps B are formed on the pair of routing electrodes 36 and 37, and the piezoelectric vibrating reed 4 is mounted using the bumps B. Accordingly, one mount electrode 16 of the piezoelectric vibrating reed 4 is electrically connected to one through electrode 32 through one routing electrode 36, and the other mount electrode 17 is electrically connected to the other through electrode 33 through the other routing electrode 37.

Further, as shown in FIGS. 1, 3, and 4, a pair of external electrodes 38 and 39, which is electrically connected to the pair of through electrodes 32 and 33, respectively, is formed on the lower surface of the base substrate 2. That is, one external electrode 38 is electrically connected to the first excitation electrode 13 of the piezoelectric vibrating reed 4 through the one through electrode 32 and one routing electrode 36. Furthermore, the other external electrode 39 is electrically connected to the second excitation electrode 14 of the piezoelectric vibrating reed 4 through the other through electrode 33 and the other routing electrode 37.

A predetermined driving voltage is applied to the external electrodes 38 and 39 formed on the base substrate 2 for the operation of the piezoelectric vibrator 1 having the above-mentioned structure. Accordingly, it may be possible to make current flow in the excitation electrode 15 including the first and second excitation electrodes 13 and 14 of the piezoelectric vibrating reed 4, and to vibrate the pair of vibration arm portions 10 and 11 at a predetermined frequency in a direction where the vibration arm portions approach each other or are separated from each other. Further, the vibration of the pair of vibration arm portions 10 and 11 may be used as a time source, a timing source of a control signal, a reference signal source, and the like.

A method of manufacturing a plurality of the above-mentioned piezoelectric vibrators 1 at a time by using a base substrate wafer 40 and a lid substrate wafer 50 will be described below with reference to the flowchart shown in FIG. 8.

First, the piezoelectric vibrating reeds 4 shown in FIGS. 5 to 7 are formed by a piezoelectric vibrating reed making process (S10). Specifically, first, a Lambert raw stone of crystal is sliced at a predetermined angle so that wafers having a uniform thickness are formed. Subsequently, after the wafer is roughly worked by lapping, a work-affected layer is removed by etching. After that, mirror polishing working such as polishing is performed so that a wafer having a predetermined thickness is formed. Subsequently, after an appropriate treatment such as cleaning is performed on the wafer, the wafer is patterned so as to have the outline of the piezoelectric vibrating reed 4 by a photolithographic technique and the excitation electrodes 15, the extraction electrodes 19 and 20, the mount electrodes 16 and 17, and the weight metal films 21 are formed by the patterning and forming of a metal film. Accordingly, it may be possible to form a plurality of piezoelectric vibrating reeds 4.

Further, after the piezoelectric vibrating reeds 4 are made, the rough adjustment of a resonant frequency is performed. The rough adjustment of the resonant frequency is performed by irradiating the rough adjustment film 21a of the weight metal film 21 with laser light so that a part of the rough adjustment film is evaporated and the weight of the weight metal film is thus changed. Meanwhile, the fine adjustment for more accurately adjusting the resonant frequency is performed after mounting. This will be described below.

Figure 9:
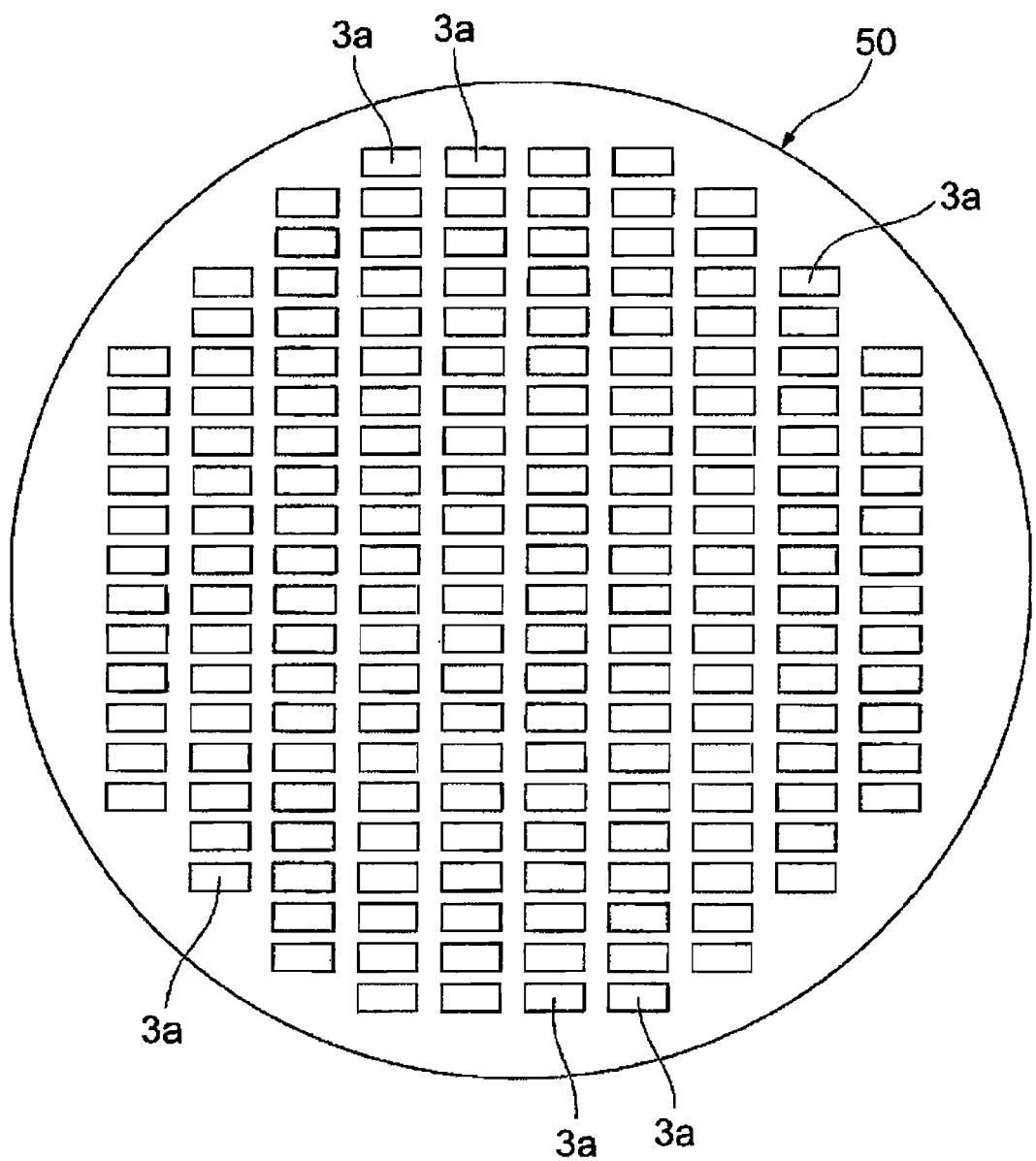
FIG. 9 is a view illustrating one process when a piezoelectric vibrator is manufactured according to the flowchart illustrated in FIG. 8, and is a view showing a state where a plurality of recesses is formed on a lid substrate wafer that is a material of a lid substrate.

After that, there is performed a first wafer making process (S20) for making the lid substrate wafer 50, which forms the lid substrate 3 later, up to a state immediately before the anodic bonding is performed. First, after soda-lime glass is polished up to a predetermined thickness and cleaned, a disk-shaped lid substrate wafer 50 of which the outermost work-affected layer is removed by etching or the like is formed (S21). Then, there is performed a recess forming process (S22) for forming a plurality of recesses 3a for cavities on the bonding surface of the lid substrate wafer 50 in row and column directions by etching or the like as shown in FIG. 9. The first wafer making process is terminated at this time.

Subsequently, simultaneously with the process or before and after the process, there is performed a second wafer making process (S30) for making the base substrate wafer 40, which forms the base substrate 2 later, up to a state immediately before the anodic bonding is performed. First, after soda-lime glass is polished up to a predetermined thickness and cleaned, a disk-shaped base substrate wafer 40 of which the outermost work-affected layer is removed by etching or the like is formed (S31). Then, there is performed a through electrode forming process (S30A) for forming a plurality of pairs of through electrodes 32 and 33 on the base substrate wafer 40. Here, the through electrode forming process will be described in detail.

Figure 10:
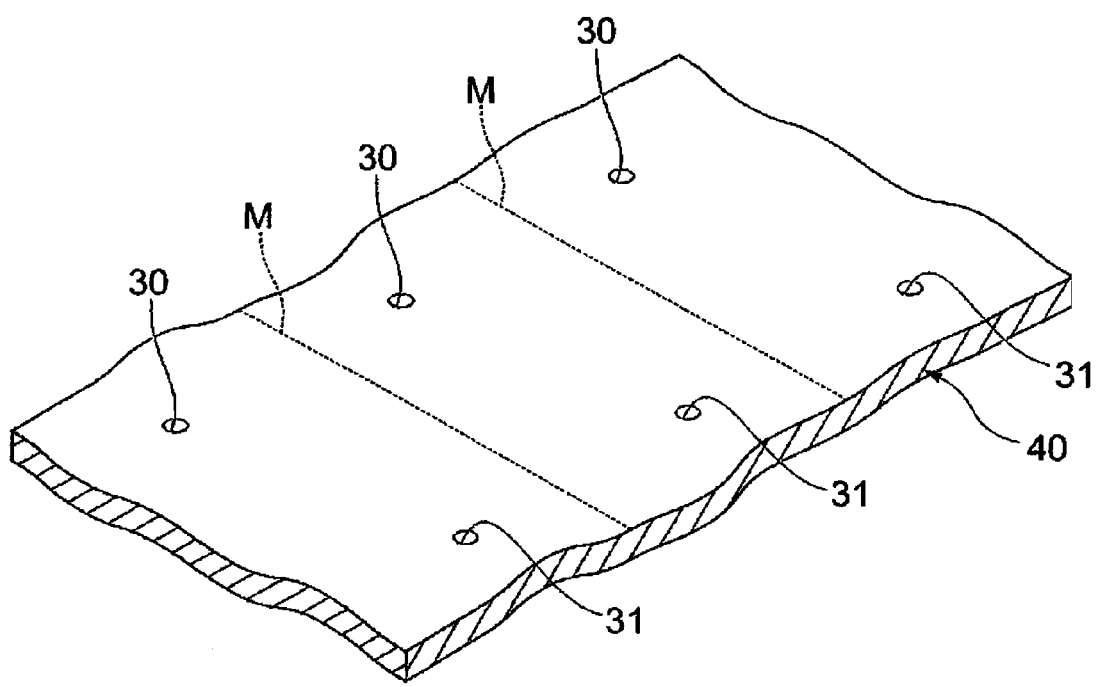
FIG. 10 is a view illustrating one process when a piezoelectric vibrator is manufactured according to the flowchart illustrated in FIG. 8, and is a view showing a state where a plurality of through holes is formed on a base substrate wafer that is a material of a base substrate.
Figure 11:
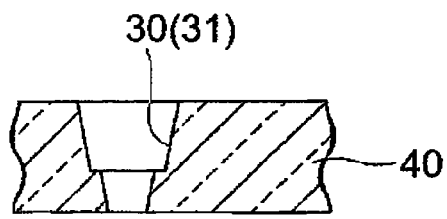
FIG. 11 is view showing the state shown in FIG. 10 as seen from a cross-section of a base substrate wafer.

First, there is performed a through hole forming process (S32) for forming a plurality of pairs of through holes 30 and 31, which passes through the wafer 40, at the base substrate wafer 40 as shown in FIG. 10. Meanwhile, dotted lines M shown in FIG. 10 are cutting lines along which cutting is performed in a cutting process to be performed later. This process is performed by performing, for example, a press work or the like from the upper surface of the base substrate wafer 40. Accordingly, it may be possible to form the through holes 30 and 31 which have a stepwise tapered shape in cross-sectional view and of which the diameter is gradually reduced in two steps toward the lower surface of the base substrate wafer 40 as shown in FIG. 11. Further, the plurality of pairs of through holes 30 and 31 is formed so as to be in the recesses 3a formed on the lid substrate wafer 50 when both the wafers 40 and 50 are superimposed later. In addition, one through hole 30 is positioned so as to correspond to the base portion 12 of the piezoelectric vibrating reed 4, and the other through hole 31 is positioned so as to correspond to the ends of the vibration arm portions 10 and 11.

Figure 12:
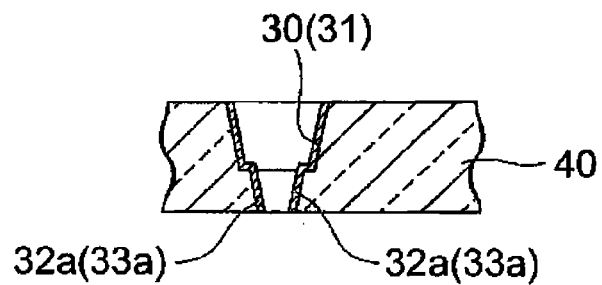
FIG. 12 is a view illustrating one process when a piezoelectric vibrator is manufactured according to the flowchart illustrated in FIG. 8, and is a view showing a state where an electrode film is formed on the inner surface of the through hole after the state shown in FIG. 11.
Figure 13:
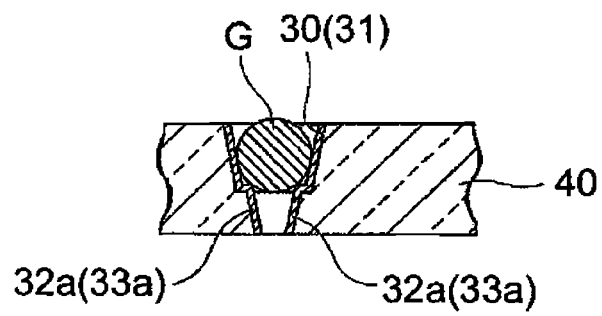
FIG. 13 is a view illustrating one process when a piezoelectric vibrator is manufactured according to the flowchart illustrated in FIG. 8, and is a view showing a state where a glass ball is fitted into the through hole after the state shown in FIG. 12.

Subsequently, there is performed an electrode film forming process (S33) for forming the electrode films 32a and 33a on the inner surfaces of the plurality of through holes 30 and 31 as shown in FIG. 12. Specifically, the electrode films 32a and 33a are formed by sputtering, for example, chrome and copper so that chrome and copper are laminated. Then, there is performed a glass body setting process (S34) for fitting spherical glass balls G (lumps of the glass body) into the through holes 30 and 31 on which the electrode films 32a and 33a have been formed as shown in FIG. 13. In this case, a glass ball G of which the volume is substantially equal to the volume of each of the through holes 30 and 31 is used as the glass ball G. Furthermore, a glass ball, which is temporarily fired in advance, is used as the glass ball G.

Figure 14:
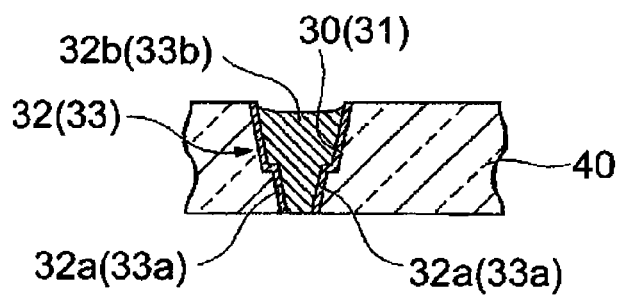
FIG. 14 is a view illustrating one process when a piezoelectric vibrator is manufactured according to the flowchart illustrated in FIG. 8, and is a view showing a state where a glass body is fixed to the inner surface of the through hole after the state shown in FIG. 13.

After that, there is performed a heating process (S35) for heating the fitted glass balls G at a predetermined temperature. First, the glass balls G, which are fitted into the through holes 30 and 31, are melted by performing the heating process. In this case, since the volume of the fitted glass ball G is substantially equal to the volume of each of the through holes 30 and 31, each of the through holes 30 and 31 is filled with the melted glass body without spaces, so that the through holes are closed. Accordingly, the glass bodies 32b and 33b are solidly fixed to the inner surfaces of the through holes 30 and 31 with the electrode films 32a and 33a interposed therebetween so as to close the through holes 30 and 31 as shown in FIG. 14. As a result, the through electrodes 32 and 33 are formed of the electrode films 32a and 33a and the glass bodies 32b and 33b.

In particular, when the through electrodes 32 and 33 are formed, the through electrodes 32 and 33 are formed using the electrode films 32a and 33a and the glass bodies 32b and 33b without using paste, unlike the related art. If paste is used, the paste needs to be fired. In general, since organic materials contained in the paste are evaporated during the firing, the volume of fired paste is significantly decreased in comparison with the volume of unfired paste. For this reason, if paste is fired after being filled in the through holes 30 and 31 alone, large recesses are formed on the surfaces of the fired paste.

However, since paste is not used and the electrode films 32a and 33a and the glass bodies 32b and 33b are used as described above, there is no concern that large recesses are formed on the surfaces of the glass bodies and electrode films. Meanwhile, the volume of each of the glass bodies 32b and 33b is slightly decreased in the heating process. However, unlike the case of the firing of paste, the decrease of the volume of the glass bodies is not significant enough to form a visible recess and is in a negligible range.

Accordingly, the surfaces of the base substrate wafer 40 are substantially flush with the surfaces of the glass bodies 32b and 33b. That is, it may be possible to make the surfaces of the base substrate wafer 40 be substantially flush with the surfaces of the through electrodes 32 and 33.

Figure 15:
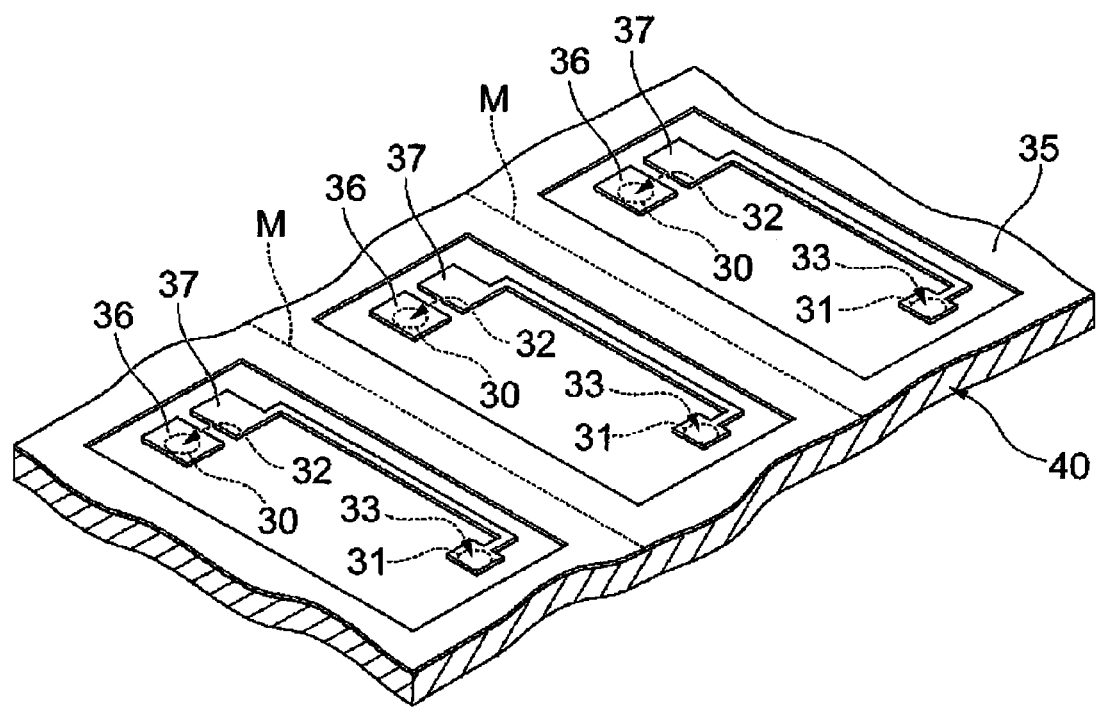
FIG. 15 is a view illustrating one process when a piezoelectric vibrator is manufactured according to the flowchart illustrated in FIG. 8, and is a view showing a state where a bonding film and routing electrodes are patterned on the upper surface of the base substrate wafer after the state shown in FIG. 14.
Figure 16:
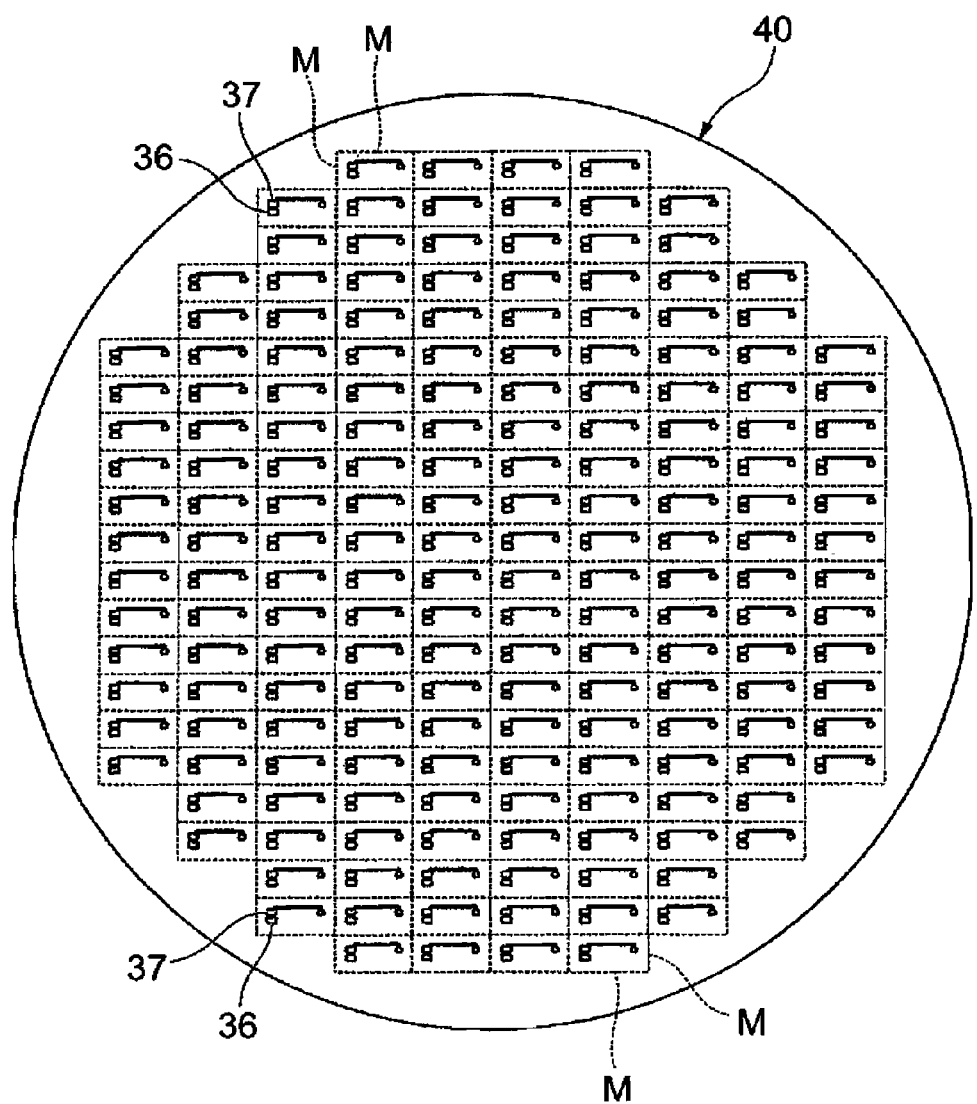
FIG. 16 is a view showing the entire base substrate wafer that is in the state shown in FIG. 15.

After that, there is performed a bonding film forming process (S36) for forming the bonding film 35 as shown in FIGS. 15 and 16 by performing patterning on the upper surface of the base substrate wafer 40 with a conductive material, and there is performed a routing electrode forming process (S37) for forming a plurality of routing electrodes 36 and 37, which is electrically connected to the pairs of through electrodes 32 and 33, respectively. Meanwhile, dotted lines M shown in FIGS. 15 and 16 are cutting lines along which cutting is performed in a cutting process to be performed later.

In particular, the through electrodes 32 and 33, which are formed of the electrode films 32a and 33a and the glass bodies 32b and 33b, do not have recesses on the surfaces thereof and are substantially flush with the upper surface of the base substrate wafer 40 as described above. For this reason, the routing electrodes 36 and 37, which are patterned on the upper surface of the base substrate wafer 40, come into close contact with the through electrodes 32 and 33 without spaces therebetween. Accordingly, it may be possible to reliably secure the electric conductivity between one routing electrode 36 and one through electrode 32, and the electric conductivity between the other routing electrode 37 and the other through electrode 33. The second wafer making process is terminated at this time.

Figure 8:
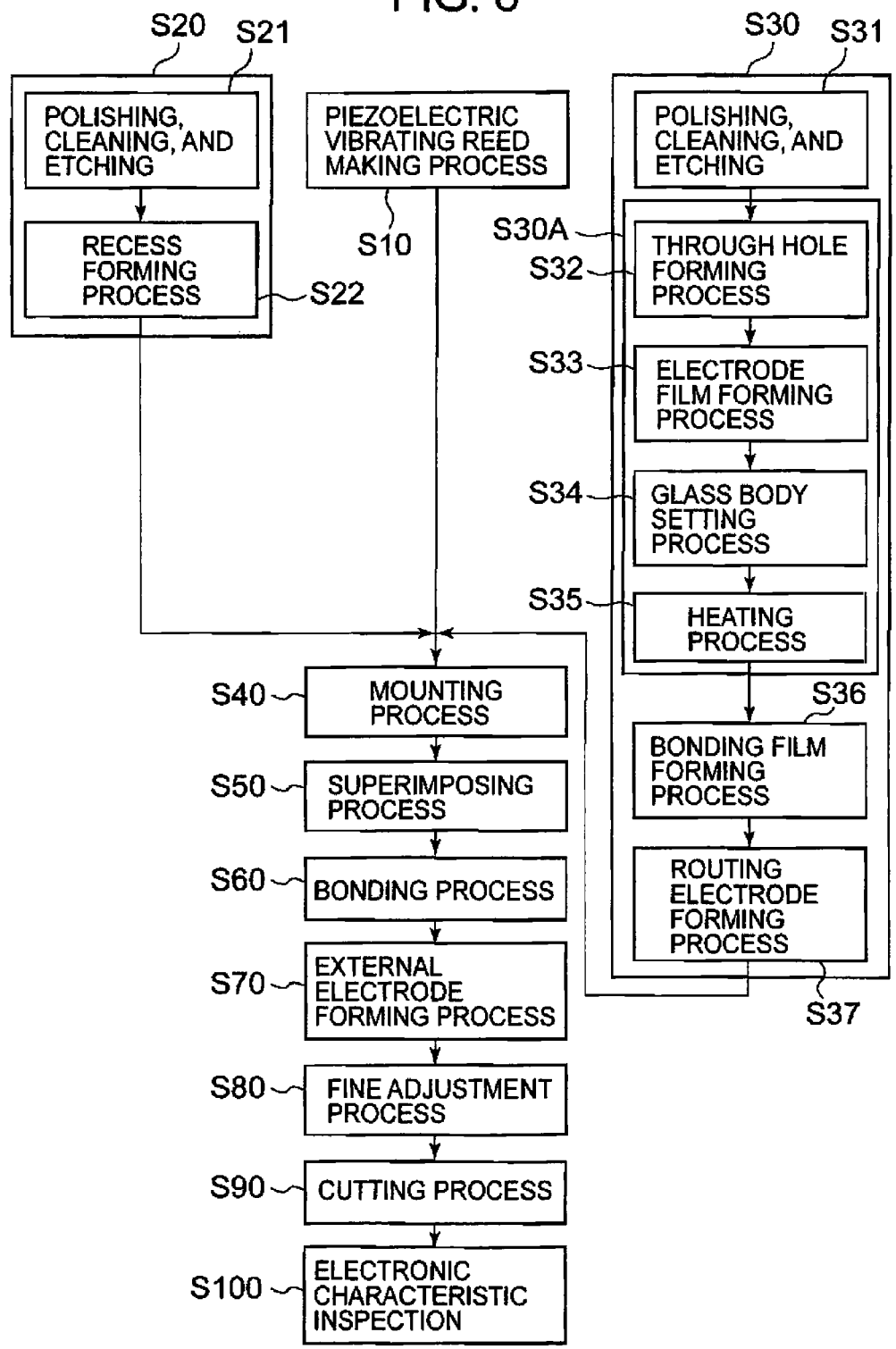
FIG. 8 is a flowchart illustrating a process flow during the manufacture of the piezoelectric vibrator shown in FIG. 1.

Meanwhile, in a process sequence shown in FIG. 8, the routing electrode forming process (S37) has been performed after the bonding film forming process (S36). However, the bonding film forming process (S36) may be performed after the routing electrode forming process (S37) in reverse to this, and both processes may be performed at the same time. In any process sequence, it may be possible to achieve the same advantage. Accordingly, the process sequence may be appropriately changed as needed basis.

After that, there is performed a mounting process (S40) for bonding the plurality of made piezoelectric vibrating reeds 4 to the upper surface of the base substrate wafer 40 through the routing electrodes 36 and 37, respectively. First, the bumps B made of gold or the like are formed on the pairs of routing electrodes 36 and 37. Further, after the base portions 12 of the piezoelectric vibrating reeds 4 are placed on the bumps B, the piezoelectric vibrating reeds 4 are pressed against the bumps B while the bumps B are heated to a predetermined temperature. Accordingly, the piezoelectric vibrating reeds 4 are mechanically supported by the bumps B and the mount electrodes 16 and 17 are electrically connected to the routing electrodes 36 and 37. Therefore, the pair of the excitation electrodes 15 of the piezoelectric vibrating reed 4 is electrically connected to the pair of through electrodes 32 and 33, respectively.

In particular, since being bonded by bumps, the piezoelectric vibrating reed 4 is supported so as to be floated from the upper surface of the base substrate wafer 40.

After the mounting of the piezoelectric vibrating reeds 4 is terminated, there is performed a superimposing process (S50) for superimposing the lid substrate wafer 50 on the base substrate wafer 40. Specifically, while reference marks (not shown) are used as indexes, both the wafers 40 and 50 are aligned in position. Accordingly, the mounted piezoelectric vibrating reeds 4 are received in the cavities C that are surrounded by the wafers 40 and 50 and the recesses 3a formed on the base substrate wafer 40, respectively.

Figure 17:
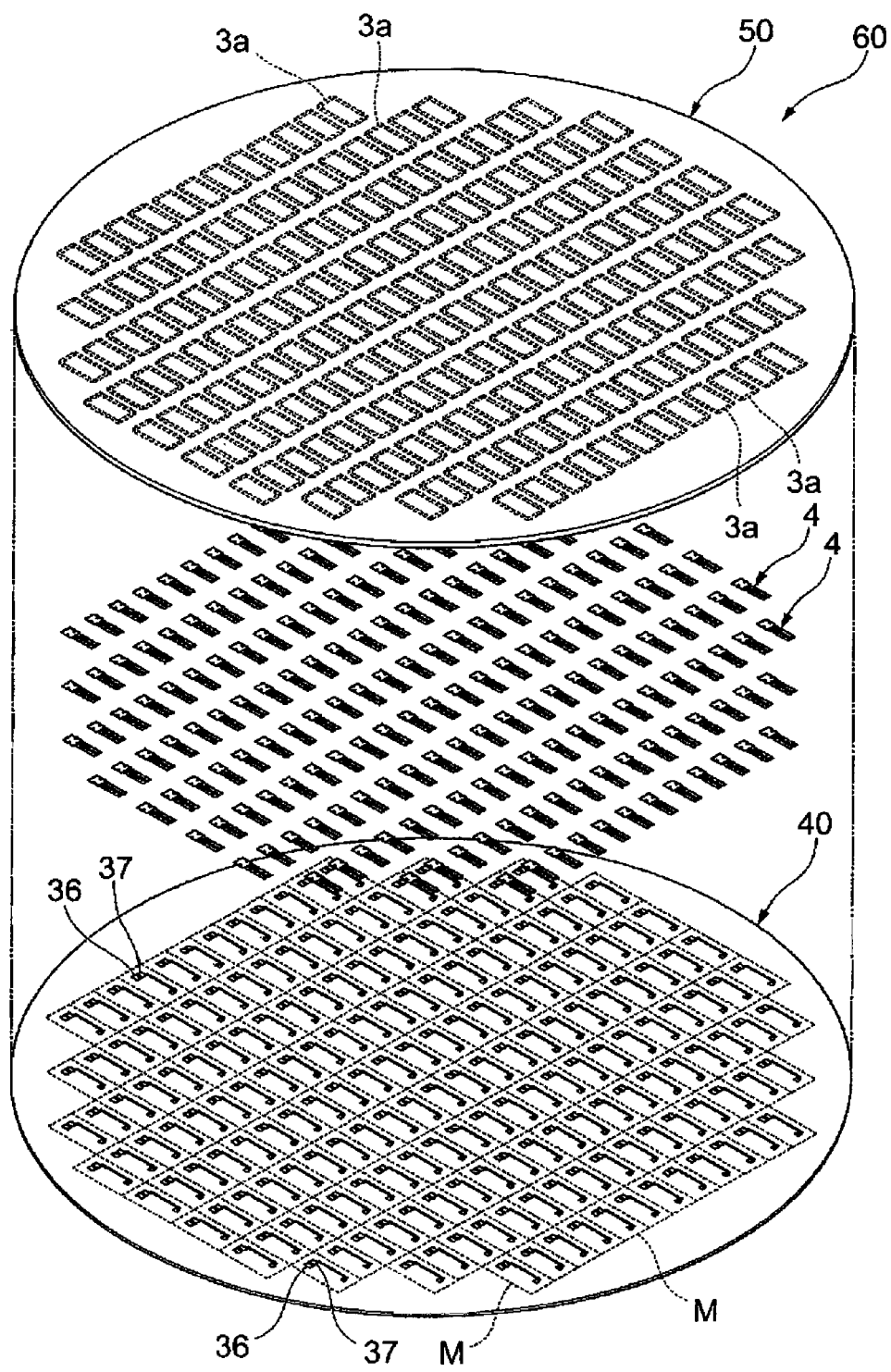
FIG. 17 is a view illustrating one process when a piezoelectric vibrator is manufactured according to the flowchart illustrated in FIG. 8, and is an exploded perspective view of a wafer where the base substrate wafer and the lid substrate wafer are anodically bonded to each other so that the piezoelectric vibrating reeds are in cavities.

After the superimposing process, there is performed a bonding process (S60) for anodically bonding the two superimposed wafers by applying a predetermined voltage in a predetermined temperature atmosphere after putting two superimposed wafers 40 and 50 in an anodic bonding apparatus (not shown). Specifically, a predetermined voltage is applied between the bonding film 35 and the lid substrate wafer 50. Accordingly, an electrochemical reaction occurs on the interface between the bonding film 35 and the lid substrate wafer 50, and the bonding film and the lid substrate wafer come into close contact with each other and are anodically bonded to each other. Accordingly, it may be possible to seal the piezoelectric vibrating reed 4 in the cavity C, and to obtain a wafer 60 shown in FIG. 17 where the base substrate wafer 40 and the lid substrate wafer 50 are bonded to each other. Meanwhile, for the easy understanding of the drawing, the exploded wafer 60 is shown in FIG. 17, and the bonding film 35 is not shown from the base substrate wafer 40. Meanwhile, dotted lines M shown in FIG. 17 are cutting lines along which cutting is performed in a cutting process to be performed later.

When the anodic bonding is performed, the through holes 30 and 31 formed at the base substrate wafer 40 are completely closed by the through electrodes 32 and 33. Accordingly, airtightness in the cavity C is not impaired through the through holes 30 and 31. In particular, since the glass bodies 32b and 33b of the through electrodes 32 and 33 solidly come into close contact with the inner surfaces of the through holes 30 and 31 with the electrode films 32a and 33a interposed therebetween so as to close the through holes 30 and 31, it may be possible to reliably maintain airtightness in the cavity C.

After the above-mentioned anodic bonding is terminated, there is performed an external electrode forming process (S70) for forming the plurality of pairs of external electrodes 38 and 39, which is electrically connected to the pairs of through electrodes 32 and 33, respectively, by performing patterning on the lower surface of the base substrate wafer 40 with a conductive material. Due to this process, it is possible to actuate the piezoelectric vibrating reed 4, which is sealed in the cavity C, by using the external electrodes 38 and 39.

In particular, even when this process is performed, the through electrodes 32 and 33 are substantially flush with the lower surface of the base substrate wafer 40 like when the routing electrodes 36 and 37 are formed. For this reason, the patterned external electrodes 38 and 39 come into close contact with the through electrodes 32 and 33 without spaces therebetween. Accordingly, it may be possible to reliably secure the electric conductivity between the external electrodes 38 and 39 and the through electrodes 32 and 33.

After that, there is performed a fine adjustment process (S80) for finely adjusting the frequency of each of the piezoelectric vibrators 1 that are sealed in the cavities C in the state of the wafer 60. In detail, a voltage is applied to the pairs of the external electrodes 38 and 39 that are formed on the lower surface of the base substrate wafer 40, so that the piezoelectric vibrating reeds 4 are vibrated. Further, while the frequency is measured, laser light is irradiated from the outside through the lid substrate wafer 50, thereby evaporating the fine adjustment film 21b of the weight metal film 21. Accordingly, the weight of the ends of the pair of vibration arm portions 10 and 11 is changed. As a result, it may be possible to finely adjust the frequency of the each of the piezoelectric vibrating reeds 4 so that the frequency of the piezoelectric vibrating reeds is in a predetermined nominal frequency range.

After the fine adjustment of frequency is terminated, there is performed a cutting process (S90) for cutting the bonded wafer 60 into small pieces along the cutting lines M shown in FIG. 17. As a result, it may be possible to manufacture a plurality of two-layer structure type surface mounted piezoelectric vibrators 1 of which one is shown in FIG. 1 and the piezoelectric vibrating reed 4 is sealed in the cavity C formed between the base substrate 2 and lid substrate 3 bonded to each other.

Meanwhile, the fine adjustment process (S80) may be performed after the wafer is cut into individual piezoelectric vibrators 1 by the cutting process (S90). However, if the fine adjustment process (S80) is performed ahead as described above, fine adjustment can be performed in the state of the wafer 60, so that it may be possible to more efficiently perform the fine adjustment of the plurality of piezoelectric vibrators 1. Accordingly, since it may be possible to improve throughput, this is more preferable.

After that, an internal electronic characteristic inspection is performed (S100). That is, the drive level characteristics, the resonance resistance value, the resonant frequency (excitation power dependence of resonance resistance value and resonant frequency) and the like of the piezoelectric vibrating reeds 4 are measured and checked. Further, insulation resistance characteristics and the like are also checked. Furthermore, the appearances of the piezoelectric vibrators 1 are finally inspected to finally check dimension, quality, and the like. As a result, the manufacture of the piezoelectric vibrators 1 is terminated.

In particular, since the through electrodes 32 and 33 may be formed in the piezoelectric vibrator 1 according to this embodiment so as to be substantially flush with the base substrate 2, it may be possible to make the through electrodes 32 and 33 reliably come into close contact with the routing electrodes 36 and 37 and the external electrodes 38 and 39. As a result, stable electric conductivity between the piezoelectric vibrating reed 4 and the external electrodes 38 and 39 may be secured, so that it may be possible to improve the reliability of operating performance. Therefore, it may be possible to improve the performance of the piezoelectric vibrator. Moreover, since the through electrodes 32 and 33 are formed using the electrode films 32a and 33a that are formed on the inner surfaces of the through holes 30 and 31, it may be possible to obtain very stable electric conductivity.

Furthermore, since it may be possible to reliably maintain airtightness in the cavity C, it may be possible to improve the quality of the piezoelectric vibrator even in this regard. In particular, since the glass ball G used in this embodiment has been temporarily fired in advance, the volume of the glass ball is hardly decreased when the glass ball is heated later. For this reason, higher-quality through electrodes 32 and 33 may be formed, so that it may be possible to more reliably maintain airtightness in the cavity C. As a result, it may be possible to further improve the quality of the piezoelectric vibrator 1.

In addition, since it may be possible to form the through electrodes 32 and 33 by a simple method using the electrode films 32a and 33a and the glass bodies 32b and 33b, it may be possible to simplify processes. In particular, in this embodiment, the through holes 30 and 31 are formed in the through hole forming process so that the opening of the through hole opened to the lower surface of the base substrate wafer 40 is smaller than the opening of the through hole opened to the upper surface of the base substrate wafer. Accordingly, the glass balls G, which are fitted from the upper surface of the base substrate wafer, do not fall out from the lower surface of the base substrate wafer. Therefore, the glass balls G do not fall out and are not lost between the glass body setting process and the heating process. As a result, it may be possible to further simplify processes without requiring extra working hours. In addition, the glass balls G do not fall out from the lower surface of the base substrate wafer, and are held in the through holes 30 and 31. That is, if the glass balls are merely fitted into the through holes 30 and 31 from the upper surface of the base substrate wafer, the glass balls may be held in the through holes 30 and 31. Accordingly, it may be possible to further simplify processes even in this regard.

Further, according to the manufacturing method of this embodiment, it may be possible to manufacture a plurality of the piezoelectric vibrators 1 at a time. Accordingly, it may be possible to reduce the manufacturing cost of the piezoelectric vibrator.

An embodiment of an oscillator according to the invention will be described below with reference to FIG. 18.

Figure 18:
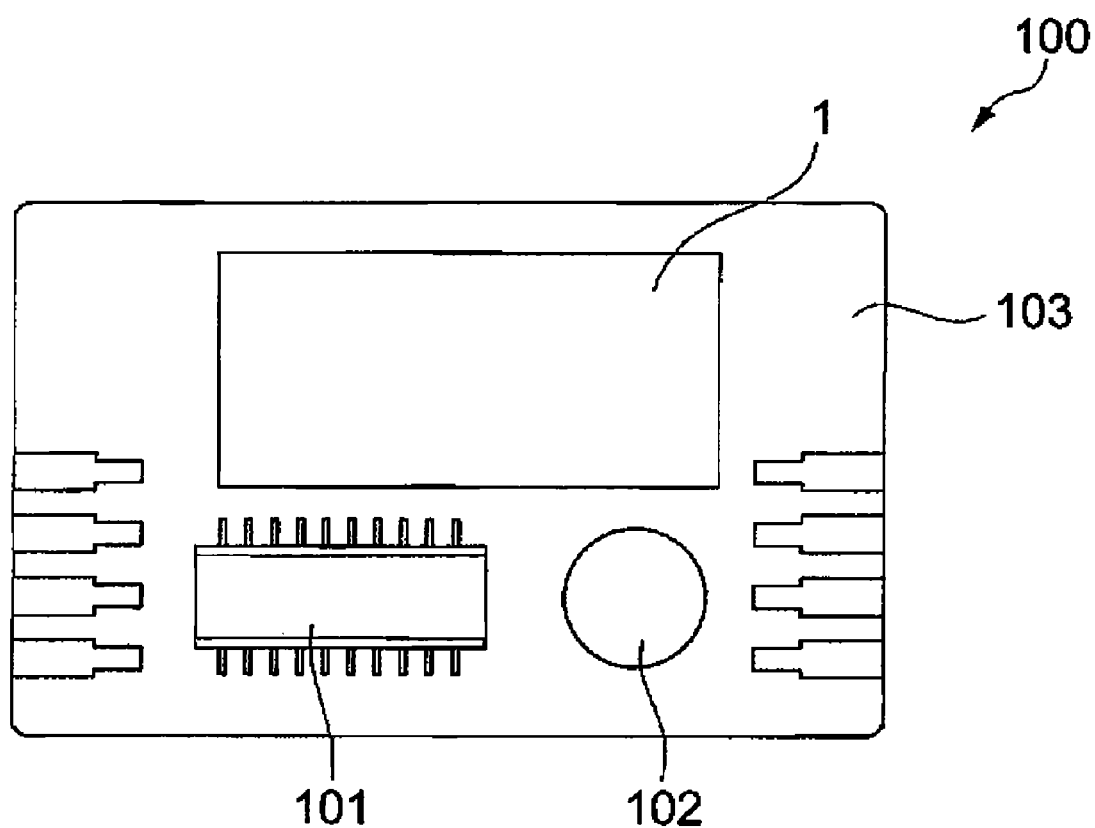
FIG. 18 is a view showing the configuration of an embodiment of an oscillator according to the invention.

As shown in FIG. 18, an oscillator 100 according to this embodiment includes the piezoelectric vibrator 1 as an oscillating component that is electrically connected to an integrated circuit 101. The oscillator 100 includes a substrate 103 on which an electronic component 102 such as a capacitor is mounted. The integrated circuit 101 for the oscillator is mounted on the substrate 103, and the piezoelectric vibrator 1 is mounted near the integrated circuit 101 on the substrate. The electronic component 102, the integrated circuit 101, and the piezoelectric vibrator 1 are electrically connected to one another by wiring patterns (not shown). Meanwhile, each of the components is molded with a resin (not shown).

When a voltage is applied to the piezoelectric vibrator 1 of the oscillator 100 having the above-mentioned structure, the piezoelectric vibrating reed 4 of the piezoelectric vibrator 1 vibrates. The vibration is converted into an electrical signal due to the piezoelectric characteristics of the piezoelectric vibrating reed 4, and is input to the integrated circuit 101 as an electrical signal. The input electrical signal is subjected to various processes by the integrated circuit 101 and is output as a frequency signal. Accordingly, the piezoelectric vibrator 1 functions as an oscillating component.

Further, it is possible to add a function of controlling date or time of the operation of the device or an external device other than a single-function oscillator for a clock and the like or a function of providing time or a calendar by selectively setting the structure of the integrated circuit 101, for example, an RTC (real time clock) module and the like in compliance with demand.

As described above, the oscillator 100 according to this embodiment includes the high-quality piezoelectric vibrator 1 that has reliable airtightness in the cavity C and improved reliability of operation. Accordingly, likewise, it may also be possible to improve the quality of the oscillator 100 by improving the reliability of operation. In addition to this, it may be possible to obtain a stable and accurate frequency signal over a long period of time.

Figure 19:
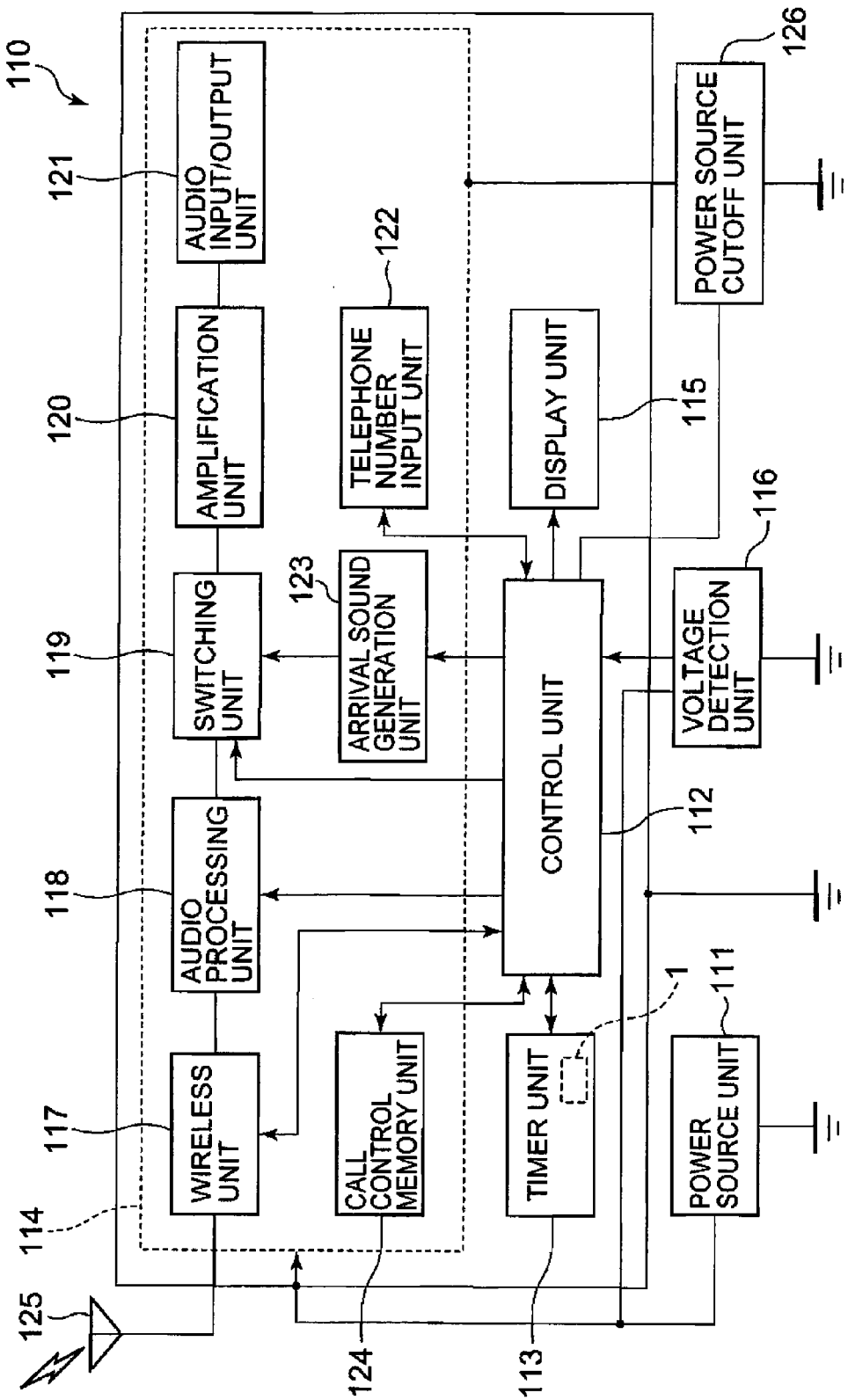
FIG. 19 is a view showing the configuration of an embodiment of an electronic device according to the invention.

An embodiment of an electronic device according to the invention will be described with reference to FIG. 19. Meanwhile, a portable information device 110 including the above-mentioned piezoelectric vibrator 1 will be exemplified as the electronic device. First, the portable information device 110 according to this embodiment is typified by, for example, a cell phone, and is obtained by developing and improving a watch in the related art. The portable information device is similar to a watch in appearance, a liquid crystal display is disposed at a portion of the portable information device corresponding to a dial, and the portable information device can display current time and the like on a screen of the liquid crystal display. Further, when the portable information device is used as a communication device, the portable information device may be used to perform communication like the cell phone in the related art through a speaker and a microphone that are built in an inner portion of a band after being separated from a wrist. However, the size and weight of the portable information device are much smaller than those of the cell phone in the related art.

The structure of the portable information device 110 according to this embodiment will be described below. As shown in FIG. 19, the portable information device 110 includes the piezoelectric vibrator 1 and a power supply unit 111 for supplying power. The power supply unit 111 is formed of, for example, a lithium secondary battery. A control unit 112 that performs various kind of control, a clock unit 113 that counts time and the like, a communication unit 114 that communicates with the outside, a display unit 115 that displays various kinds of information, and a voltage detection unit 116 that detects voltages of the respective functional units are connected in parallel to the power supply unit 111. Further, power is supplied to each of the functional units by the power supply unit 111.

The control unit 112 controls the operation of the entire system, such as the transmission and reception of voice data and the measurement or display of the current time, by controlling the respective functional units. Further, the control unit 112 includes a ROM where a program is written in advance, a CPU that reads out and executes the program written in the ROM, a RAM that is used as a work area of the CPU, and the like.

The clock unit 113 includes an integrated circuit and the piezoelectric vibrator 1. An oscillation circuit, a register circuit, a counter circuit, an interface circuit, and the like are built in the integrated circuit. When a voltage is applied to the piezoelectric vibrator 1, the piezoelectric vibrating reed 4 vibrates. The vibration is converted into an electrical signal due to the piezoelectric characteristics of crystal, and is input to the oscillation circuit as an electrical signal. The output of the oscillation circuit is binarized and counted by the register circuit and the counter circuit. Further, the clock unit transmits/receives a signal to/from the control unit 112 through the interface circuit. Current time, current date, calendar information, or the like is displayed on the display unit 115.

The communication unit 114 has the same function as the cell phone in the related art. The communication unit includes a wireless part 117, a voice processing part 118, a switching part 119, an amplifying part 120, a voice input/output part 121, a phone number input part 122, a ringtone generating part 123, and a call control memory part 124.

The wireless part 117 transmits/receives various data such as voice data to/from a base station through an antenna 125. The voice processing part 118 encodes and decodes a voice signal that is input from the wireless part 117 or the amplifying part 120. The amplifying part 120 amplifies a signal, which is input from the voice processing part 118 or the voice input/output part 121, up to a predetermined level. The voice input/output part 121 is formed of a speaker or a microphone or the like, and amplifies a ringtone or a received voice or collects a voice.

Further, the ringtone generating part 123 generates a ringtone in accordance with a call from a base station. The switching part 119 switches the amplifying part 120, which is connected to the voice processing part 118, to the ringtone generating part 123 when a call is received, so that the ringtone generated by the ringtone generating part 123 is output to the voice input/output part 121 through the amplifying part 120.

Meanwhile, the call control memory part 124 stores a program that is related to the outgoing/incoming call control of communication. Further, the phone number input part 122 includes number keys corresponding to, for example, 0 to 9 and other keys. When these number keys or the like are pressed down, the phone number of a callee is input.

When the voltage, which is applied to each functional unit such as the control unit 112 by the power supply unit 111, is lower than a predetermined value, the voltage detection unit 116 detects the voltage drop and notifies the control unit 112 of the voltage drop. The predetermined voltage value in this case is a value that is preset as the minimum voltage required for stably operating the communication unit 114, and is, for example, about 3 V. The control unit 112, which receives a notice of the voltage drop from the voltage detection unit 116, prohibits the operation of the wireless part 117, the voice processing part 118, the switching part 119, and the ringtone generating part 123. In particular, it is essential to stop the operation of the wireless part 117 having large power consumption. Further, a fact that the communication unit 114 is not available due to the lack of the battery power is displayed on the display unit 115.

That is, the operation of the communication unit 114 is prohibited by the voltage detection unit 116 and the control unit 112, and a fact that the operation of the communication unit is prohibited by the voltage detection unit and the control unit may be displayed on the display unit 115. The display may be a short message. However, an "x" (cross) mark may be displayed at a phone icon, which is displayed at an upper portion on the display screen of the display unit 115, as an intuitive display.

Meanwhile, if there is provided a power cutting-off unit 126 that can selectively cut off power applied to parts related to a function of the communication unit 114, it may be possible to more reliably stop the function of the communication unit 114.

As described above, the portable information device 110 according to this embodiment includes the high-quality piezoelectric vibrator 1 that has reliable airtightness in the cavity C and improved reliability of operation. Accordingly, likewise, it may also be possible to improve the quality of the portable information device by improving the reliability of the operation of the piezoelectric vibrator. In addition to this, it may be possible to display a stable and accurate clock information signal over a long period of time.

An embodiment of a radio clock according to the invention will be described with reference to FIG. 20.

Figure 20:
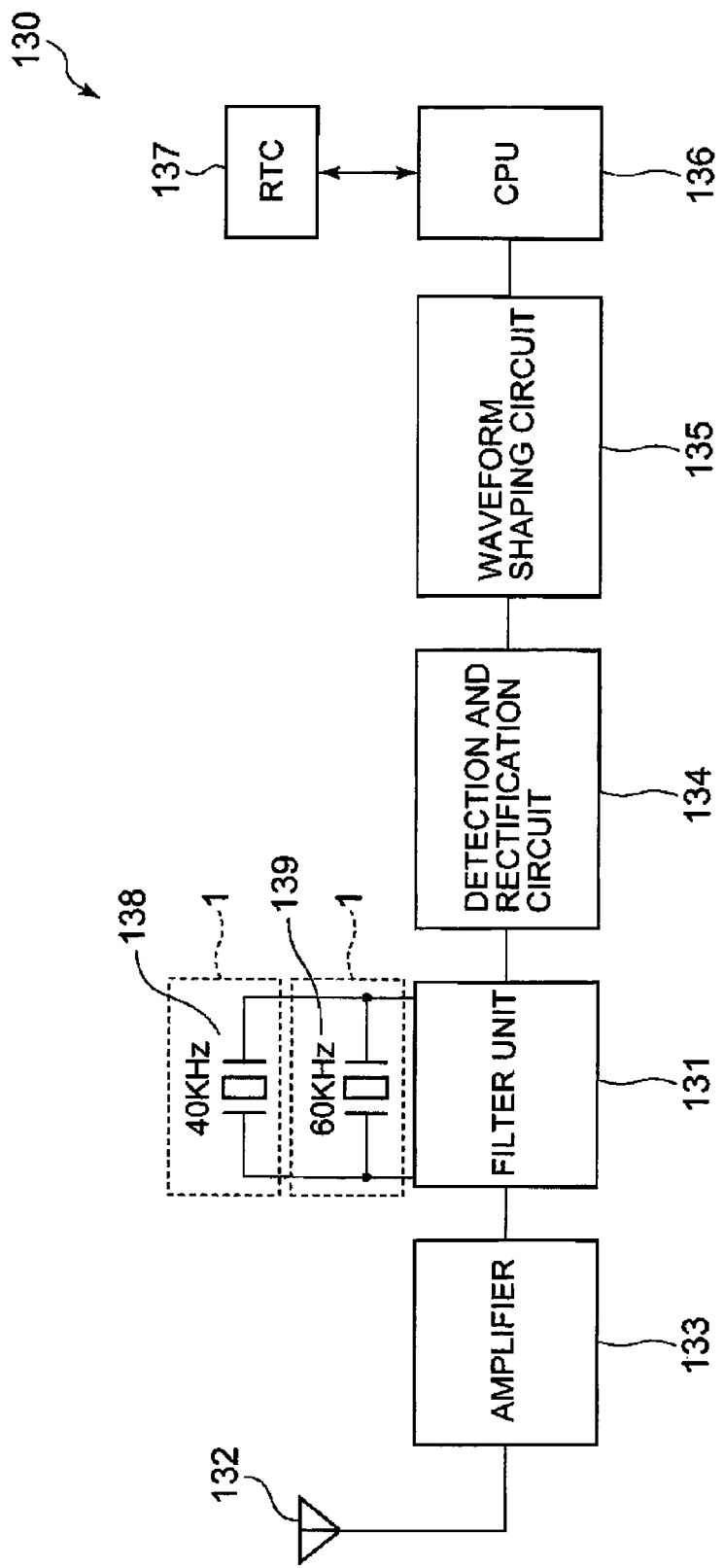
FIG. 20 is a view showing the configuration of an embodiment of a radio clock according to the invention.
Figure 21:
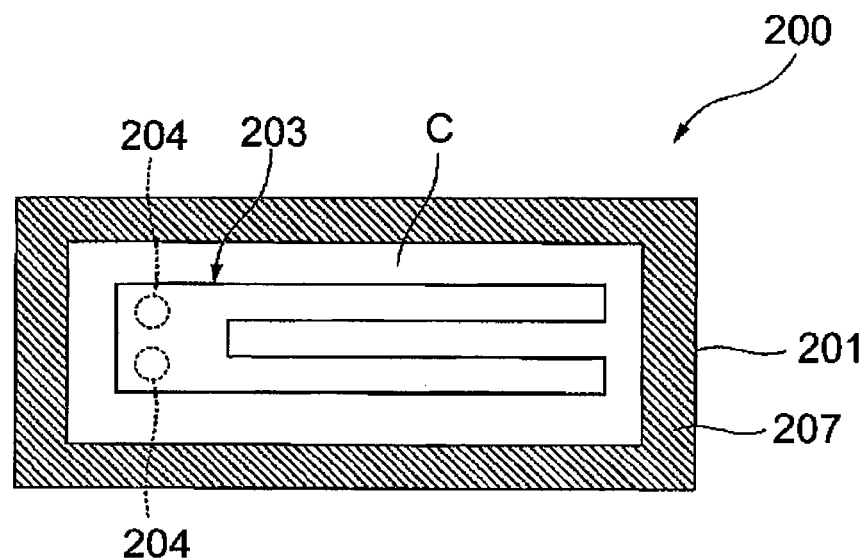
FIG. 21 is a view showing the internal structure of a piezoelectric vibrator in the related art, and is a view showing a piezoelectric vibrating reed from the upper side when a lid substrate is removed.
Figure 22:
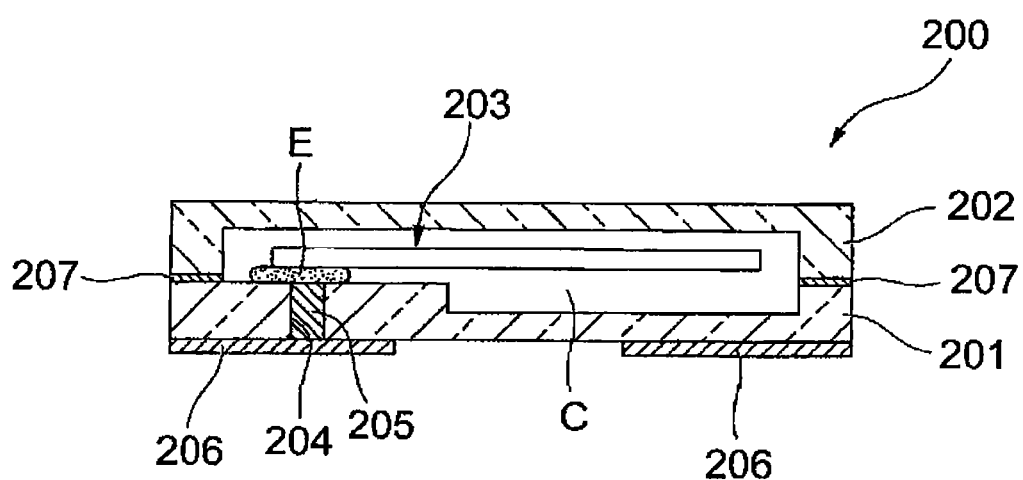
FIG. 22 is a cross-sectional view of the piezoelectric vibrator shown in FIG. 21.

As shown in FIG. 20, a radio clock 130 according to this embodiment includes the piezoelectric vibrator 1 that is electrically connected to a filter unit 131. The radio clock is a clock that has a function of receiving standard waves including clock information, a function of automatically correcting the standard waves at a correct time, and a function of displaying the standard waves.

In Japan, transmission stations (transmitter station) for transmitting standard waves are located in Fukushima-ken (40 kHz) and Saga-ken (60 kHz) and transmit standard waves. A long wave corresponding to 40 kHz or 60 kHz has a property of propagating on the surface of the ground and a property of propagating while the long wave is reflected from an ionization layer and the surface of the ground. Accordingly, the propagation range of the long wave is wide, and the above-mentioned two transmission stations cover the entire area of Japan.

The functional structure of the radio clock 130 will be described in detail below.

An antenna 132 receives standard waves that are long waves corresponding to 40 kHz or 60 kHz. The standard wave, which is a long wave, is a wave that is obtained by performing AM modulation of time information, which is called time codes, in a carrier wave corresponding to 40 kHz or 60 kHz. The reception standard wave, which is a long wave, is amplified by the amplifier 133, and is filtered and synchronized by the filter unit 131 including a plurality of piezoelectric vibrators 1.

The piezoelectric vibrators 1 of this embodiment include crystal vibrator parts 138 and 139 having resonant frequencies of 40 kHz and 60 kHz, which are equal to the carrier frequencies, respectively.

Further, the filtered signal having a predetermined frequency is detected and demodulated by a detection/rectification circuit 134. Subsequently, the time codes are extracted through a wave-shaping circuit 135, and are counted by a CPU 136. The CPU 136 reads out information, such as the current year, accumulated days, a day of the week, and time. The read information is reflected in the RTC 137, so that correct time information is displayed.

Since the carrier wave corresponds to 40 kHz or 60 kHz, a vibrator having the above-mentioned tuning-fork type structure is preferably used as each of the crystal vibrator parts 138 and 139.

Meanwhile, the case of Japan has been exemplified above, but the frequency of the standard wave, which is a long wave, varies abroad. For example, a standard wave corresponding to 77.5 KHz is used in Germany. Accordingly, when a radio clock 130, which can be used even abroad, is to be built in a portable device, there is needed a piezoelectric vibrator 1 having a frequency different from a frequency of the case of Japan.

As described above, the radio clock 130 according to this embodiment includes the high-quality piezoelectric vibrator 1 that has reliable airtightness in the cavity C and improved reliability of operation. Accordingly, likewise, it may also be possible to improve the quality of the radio clock by improving the reliability of operation. In addition to this, it may be possible to count a stable and accurate time over a long period of time.

Meanwhile, the technical scope of the invention is not limited to the above-mentioned embodiments, and various modifications may be made to the invention without departing from the scope of the invention.

For example, in the above-mentioned embodiments, a grooved piezoelectric vibrating reed 4 where the groove portions 18 are formed on both surfaces of the vibration arm portions 10 and 11 has been described as an example of the piezoelectric vibrating reed 4. Meanwhile, a piezoelectric vibrating reed without the groove portions 18 may be used. However, if the groove portions 18 are formed, it may be possible to improve electric field efficiency between the pair of excitation electrodes 15 when a predetermined voltage is applied to the pair of excitation electrodes 15. Accordingly, it may be possible to further suppress vibration loss and to further improve vibration characteristics. That is, it may be possible to further lower a CI value (crystal Impedance) and to further improve the performance of the piezoelectric vibrating reed 4. In this regard, it is preferable to form the groove portions 18.

Further, the tuning-fork type piezoelectric vibrating reed 4 has been exemplified in the above-mentioned embodiments, but the piezoelectric vibrating reed is not limited to a tuning-fork type piezoelectric vibrating reed. For example, a thickness-shear vibrating reed may be used.

Further, the base substrate 2 and the lid substrate 3 are anodically bonded to each other with the bonding film 35 interposed therebetween, but a method of bonding the base substrate to the lid substrate is not limited to anodic bonding. However, if being anodically bonded to each other, both the substrates 2 and 3 may be solidly bonded to each other. Accordingly, it is preferable that the base substrate and the lid substrate be anodically bonded to each other.

Furthermore, the piezoelectric vibrating reed 4 has been bonded by bumps in each of the above-mentioned embodiments, but a method of bonding the piezoelectric vibrating reed is not limited to bump bonding. For example, the piezoelectric vibrating reed 4 may be bonded by a conductive adhesive. However, if the piezoelectric vibrating reed is bonded by bumps, the piezoelectric vibrating reed 4 can be floated from the upper surface of the base substrate 2. Accordingly, it may be possible to naturally secure a minimum vibration gap that is required for vibration. Therefore, it is preferable to bond the piezoelectric vibrating reed by bumps.

Moreover, in the above-mentioned embodiment, there have been exemplified the through holes 30 and 31 that are formed by a press work so as to have the diameter gradually reduced in two steps toward the lower surface of the base substrate wafer 40 and have a stepwise tapered shape in cross-sectional view. However, as long as the through holes 30 and 31 pass through the base substrate 2, the invention is not limited thereto. For example, a through hole of which the diameter is gradually reduced toward the lower surface of the base substrate wafer 40 may be formed and a through hole passing straightly through the base substrate wafer 40 may be formed by using a sandblasting method or the like.

Further, in the above-mentioned embodiment, it is preferable to use a glass body, of which the coefficient of thermal expansion is substantially equal to the coefficient of thermal expansion of the base substrate 2 (base substrate wafer 40), as each of the glass bodies 32b and 33b (glass balls G).

In this case, the expansion amount of the glass ball G is substantially equal to that of the base substrate wafer 40 in the heating process. Accordingly, cracks or the like, which are caused by excessive pressure applied to the base substrate wafer 40 due to the difference of the coefficient of thermal expansion, are not generated at the base substrate wafer 40, or spaces caused by the excessive pressure are not formed between the glass bodies 32b and 33b and the through holes 30 and 31. For this reason, it may be possible to form higher-quality through electrodes 32 and 33. As a result, it may be possible to further improve the quality of the piezoelectric vibrator 1.

Further, a glass ball, which is temporarily fired in advance, has been used as the glass ball G in the above-mentioned embodiment, but the invention is not limited thereto. However, if a glass ball, which is temporarily fired in advance, is used, the volume of the glass ball is hardly decreased in the heating process, so that it may be possible to form higher-quality through electrodes 32 and 33. Therefore, it is preferable to use the glass ball that is temporarily fired in advance.

Furthermore, in the above-mentioned embodiment, the electrode films 32a and 33a have been formed by sputtering chrome and copper so that chrome and copper are laminated. However, the invention is not limited thereto. For example, a single electrode film may be formed by sputtering. Moreover, an electrode film may be formed by applying a conductive paste on the inner surfaces of the through holes 30 and 31 in the form of a thin film by spray coating or the like, and by firing the applied conductive paste. Even in this case, it may be possible to obtain the same advantages. Meanwhile, even though a conductive paste is used, the amount of applied conductive paste is very small. Accordingly, when the conductive paste is fired, the decrease of the volume of the conductive paste, which is caused by the disappearance of organic materials, is small. Therefore, even though an electrode film is formed by firing a conductive paste, recesses of the electrode films formed on the surfaces of the base substrate wafer 40 are very small. As a result, it may be possible to make the through electrodes 32 and 33 reliably function.

Further, in the above-mentioned embodiment, the spherical glass ball G has been fitted in the glass body setting process. However, the shape of the lump of the glass body to be fitted is not limited to a spherical shape and may be a columnar shape or a conical shape.

The invention claimed is:

1. A piezoelectric vibrator comprising:
   a hermetically closed casing comprising first and second substrates with a cavity inside, the first substrate being formed with at least one through-hole;
   an electrode film formed along an inner surface of the through-hole so as to become conductive between ends of the through-hole, wherein the electrode film does not extend beyond the through-hole;
   a piece of glass filing the through-hole which is melted and solidified in the through-hole to hermetically close the through-hole; and
   a piezoelectric vibrating strip secured inside the cavity and electrically connected via a conductive pattern to the electrode film in the through-hole in a first direction, wherein the conductive pattern is extended to cover the through-hole along a second direction, wherein the first direction is perpendicular to the second direction.

2. The piezoelectric vibrator according to claim 1, further comprising a bonding layer between the first and second substrates for anodically bonding the first and second substrates.

3. The piezoelectric vibrator according to claim 1, wherein the through-hole is configured to go smaller in cross-section from an inner surface of the first substrate towards an outer surface thereof.

4. The piezoelectric vibrator according to claim 1, wherein the through-hole has a stepped configuration such that the through-hole is larger in the first direction which is cross-section near an inner surface of the first substrate than near an outer surface thereof.

5. The piezoelectric vibrator according to claim 1, further comprising external electrodes electrically connected to the electrode films in the through-holes.

6. An oscillator comprising the piezoelectric vibrator defined in claim 1.

7. An electronic device comprising the piezoelectric vibrator defined in claim 1.

8. The electronic device according to claim 7, wherein the electronic device is an atomic clock.

* * * * *

UNITED STATES PATENT AND TRADEMARK OFFICE
CERTIFICATE OF CORRECTION

PATENT NO. : 8,058,778 B2
APPLICATION NO. : 12/857273
DATED : November 15, 2011
INVENTOR(S) : Masashi Numata et al.

It is certified that error appears in the above-identified patent and that said Letters Patent is hereby corrected as shown below:

In the Claims

In column 22, claim 1, line 29, after "a piece of glass" replace "filing" with --filling--.

Signed and Sealed this
Tenth Day of April, 2012

David J. Kappos
*Director of the United States Patent and Trademark Office*